United States Patent
Fahim et al.

(10) Patent No.: US 10,352,991 B2
(45) Date of Patent: Jul. 16, 2019

(54) EDGELESS LARGE AREA ASIC

(71) Applicant: Fermi Research Alliance, LLC, Batavia, IL (US)

(72) Inventors: Farah Fahim, Glen Ellyn, IL (US); Grzegorz W. Deptuch, Forest Park, IL (US)

(73) Assignee: Fermi Research Alliance, LLC, Batavia, IL (US)

( * ) Notice: Subject to any disclaimer, the term of this patent is extended or adjusted under 35 U.S.C. 154(b) by 266 days.

(21) Appl. No.: 15/214,758

(22) Filed: Jul. 20, 2016

(65) Prior Publication Data

US 2017/0023405 A1    Jan. 26, 2017

Related U.S. Application Data

(60) Provisional application No. 62/195,031, filed on Jul. 21, 2015.

(51) Int. Cl.
| | |
|---|---|
| *G01R 31/28* | (2006.01) |
| *H01L 27/14* | (2006.01) |
| *G01T 1/29* | (2006.01) |
| *H04N 5/32* | (2006.01) |

(52) U.S. Cl.
CPC ........ *G01R 31/2851* (2013.01); *G01T 1/2928* (2013.01); *H01L 27/14* (2013.01); *H04N 5/32* (2013.01)

(58) Field of Classification Search
CPC ......... H01L 2224/0508; H01L 21/8221; H01L 23/15
See application file for complete search history.

(56) References Cited

U.S. PATENT DOCUMENTS

| | | | |
|---|---|---|---|
| 8,913,121 | B2 | 12/2014 | Gesley |
| 8,957,504 | B2 | 2/2015 | Chao-Yuan et al. |
| 8,980,746 | B2 | 3/2015 | Kolics |
| 9,000,599 | B2 | 4/2015 | Raorane et al. |
| 9,026,969 | B2 | 5/2015 | Jang et al. |
| 9,219,038 | B2 | 12/2015 | Horng et al. |
| 9,305,864 | B2 | 4/2016 | Horng et al. |
| 9,337,063 | B2 | 5/2016 | Chen et al. |
| 9,337,114 | B2 | 5/2016 | Han et al. |
| 9,343,369 | B2 | 5/2016 | Du et al. |
| 2009/0251939 | A1 | 10/2009 | Kojima |
| 2009/0290680 | A1 | 11/2009 | Tumer et al. |

(Continued)

OTHER PUBLICATIONS

"Design and Tests of the Vertically Integrated Photon Imaging Chip", IEEE Transactions on Nuclear Science, vol. 61, No. 1, Feb. 2014, pp. 663-674, to Deputch et al.*

(Continued)

*Primary Examiner* — Kenneth J Malkowski
(74) *Attorney, Agent, or Firm* — Kermit D. Lopez; Luis M. Ortiz; Ortiz & Lopex, PLLC

(57) ABSTRACT

A three dimensional integrated edgeless pixel detector apparatus can be implemented, which includes a multi-tiered three-dimensional detector having one sensor layer, and two ASIC layers comprising an analog tier and a digital tier configured for x-ray photon time of arrival measurement and imaging. In a preferred embodiment, a hit processor can be implemented in association with a priority encoder and a configuration register and output serializer with mode selection.

36 Claims, 27 Drawing Sheets

(56) References Cited

U.S. PATENT DOCUMENTS

2014/0284752 A1    9/2014    Kalliopuska et al.
2016/0097864 A1    4/2016    Vora

OTHER PUBLICATIONS

Three-dimensional integrated circuit, Wikipedia, the free encyclopedia, printed Jun. 14, 2016, 10 pages.
Von Trapp, F., The Future of Image Sensors is Chip Stacking, 3D InCites, Sep. 15, 2014, 5 pages.
Vasile, S. et al., ASIC Readout Circuit Architecture for Large Geiger Photodiode Arrays, Goddard Space Flight Center, Greenbelt, Maryland, NASA Tech Briefs, Sep. 2012, 1 page.
Sullivan, C. T., Compound Semiconductor III-V Photonics, Sandia National Laboratories, 2 pages.
Hybrid Pixel Detectors, Advanced Photon Source, https://www1.aps.anl.gov/detectors/detector-development/hybrid-pixel-detectors, printed Jun. 14, 2016, 2 pages.
Yarema, R. et al, Vertically integrated circuit development at Fermilab for detectors, Topical Workshop on Electronics for Particle Physics Sep. 17-21, 2012, Oxford, U.K., 12 pages.
Flueckiger, J. et al., Addressing the Challenges of Photonic IC Design Via an Integrated Electronic/Photonic Design Automation Environment, Cadence Design Systems, https://www.cadence.com/content/dam/cadence-www/global/en_US/documents/tools/custom-ic-analog-rf-design/photonic-ic-design-wp.pdf, 6 pages.
Through-silicon via—Wikipedia, the free encyclopedia, printed Jun. 14, 2016, 3 pages.

\* cited by examiner

Comparing the Four Solutions — 231

| | Loss of data | Inefficiency (insertion of extra data packets) | Any ambiguity of frameClk and readoutControl at pixel? |
|---|---|---|---|
| A: correction with data loss | Yes: Last data of current frame | NO | Maybe |
| B: correction with frameClk repositioned after readoutControl | No | Yes: 2 (One from top and One from Bottom) | Maybe |
| C: correction with frameClk positioned in the center of alternating readOutControl signals | No | Yes: 2 (One from top and One from Bottom) | NO-Unlikely |
| D: correction with highest data redundancy | No | Yes 3: Two from Top/Bottom and One from the other half | NO |

FIG. 14

EDGELESS LARGE AREA ASIC

CROSS-REFERENCE TO PROVISIONAL APPLICATION

This patent application claims priority under 35 U.S.C. 119(e) to U.S. Provisional Patent Application Ser. No. 62/195,031 entitled "Edgeless Large Area ASIC," which was filed on Jul. 21, 2015, the disclosure of which is incorporated herein by reference in its entirety.

TECHNICAL FIELD

Embodiments are generally related to 3D (Three-Dimensional) integrated circuits. Embodiments are also related to ASIC (Application Specific Integrates Circuit) components and devices. Embodiments further relate to an apparatus for an edgeless large area ASIC utilized in detection applications and methods of configuring such an apparatus. Embodiments further relate to a VPIC (Vertically Integrated Photon Imaging Chip).

BACKGROUND

Detector's specifically optimized for X-ray Photon Correlation Spectroscopy (XPCS) involve imaging "speckle" patterns produced when a coherent beam of x-rays scatters off a disordered sample. The speckle pattern is essentially the superposition of many single-particle diffraction patterns produced by the atoms within the sample. As the atoms undergo motion, the speckle pattern changes, so XPCS can be used to study atomic dynamics at very short time and distance scales. Use of XPCS will continue to expand for applications associated with x-ray light sources in coming years, particularly as synchrotrons upgrade to increase coherence.

Speckle patterns produce an anomalously weak signal. With average pixel occupancies >>1% XPCS is not well suited to a traditional x-ray area detectors which read out every pixel on every exposure. Much of the data throughput would be spent processing empty pixels.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved 3D integrated circuit.

It is another aspect of the disclosed embodiments to provide for improved ASIC (Application Specific Integrates Circuit) functionality, components and devices.

It yet another aspect of the disclosed embodiments to provide an edgeless large area ASIC utilized in detection applications.

It is another aspect of the disclosed embodiments to provide an improved method of designing large area ASIC utilized in detection applications with computer aided design tools of moderate cell count capabilities.

The aforementioned aspects and other objectives and advantages can now be achieved as described herein. In an example embodiment, a three dimensional integrated edgeless pixel detector apparatus can be implemented, which includes a large area three tier three-dimensional detector having one sensor layer, and two ASIC layers comprising an analog tier and a digital tier configured for x-ray photon time of arrival or energy measurement and imaging.

In a preferred embodiment, a per pixel hit processor 820 in FIG. 17 can be implemented in association with a priority encoder 70 in FIG. 2 and 920 in FIG. 25 and a configuration register 82 in FIG. 2 and output serializer 88 in FIG. 2 with mode selection. The digital tier (or digital tiers) is edgeless and comprises an array of physically indivisible edgeless sub-chips. The digital tier (or digital tiers) connects to the analog tiers (or analog tiers), retaining regular segmentation that can also be edgeless.

Such an apparatus can be configured to include a plurality of analog pixels in the analog tier, wherein each analog pixel among the plurality of pixels includes an amplification chain comprising a charge sensitive amplifier with sensor leakage current compensation followed by an at least one-stage shaping filter and several comparators.

Additionally, in some example embodiments, a hit processor 820 in FIG. 17 can be implemented, which accepts outputs from the comparators and increments counters to register a number of photon hits in an analog pixel among the plurality of pixels in a time frame.

Additionally, in some example embodiments, a hit processor 820 in FIG. 17 can be implemented, which accepts outputs from the comparators and increments a counter to register the time of arrival or to measure energy in an analog pixel among the plurality of pixels in a time frame.

In some example embodiment, the digital tier can include digital functionality not confined within a pixel but distributed across an array to create functionally independent sub-chips. The digital functionality can further include a high-speed output serializer in association with a plurality of differential line drivers and receivers and a plurality of chip level functional components. The digital tier and the analog tier are preferably face-to-face connected by a uniform fusion-bonding interface.

Additionally, a ceramic substrate or other material-based printed circuit-type board can be provided upon at which at least one ASIC layer of the two ASIC layers is electrically connected (bump bonded) to it. Such a ceramic substrate can be a low temperature co-fired ceramic.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

FIG. 14 illustrates a table comparing the four solutions discussed herein, in accordance with an example embodiment;

DETAILED DESCRIPTION

Figure 1:
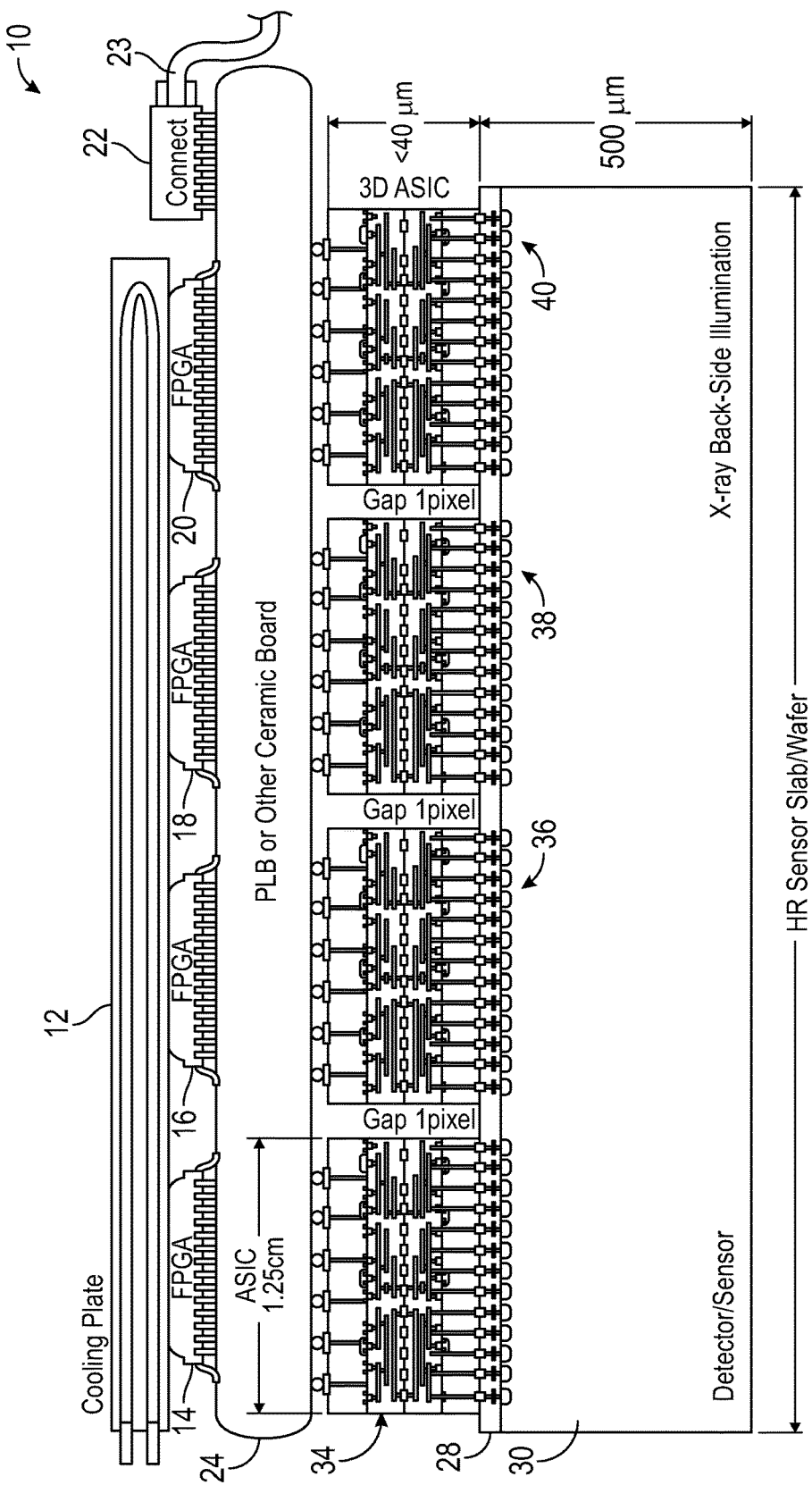
FIG. 1 illustrates a side cut-away view of a single module 3D integrated edgeless detector apparatus, in accordance with an example embodiment.

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Typically, or if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again depending at least in part on context.

As discussed previously, a detector specifically optimized for X-ray Photon Correlation Spectroscopy (XPCS) involves imaging "speckle" patterns produced when a coherent beam of x-rays scatters off a disordered sample. The speckle pattern is essentially the superposition of many single-particle diffraction patterns produced by the atoms within the sample. As the atoms undergo motion, the speckle pattern changes, so XPCS can be used to study atomic dynamics at very short time and distance scales. Use of XPCS will continue to expand for applications associated with x-ray light sources in coming years, particularly as synchrotrons upgrade to increase coherence.

Speckle patterns produce an anomalously weak signal. With average pixel occupancies <<1%, XPCS is not well suited to a traditional x-ray area detectors which read out every pixel on every exposure. Much of the data throughput would be spent processing empty pixels.

A technique-specific detector utilizing a Vertically Integrated Photon Imaging Chip (VIPIC) can provide several unique capabilities designed to address the challenges of XPCS and enable new science. These properties include sparsified readout, high time resolution, and real-time calculation of auto-correlation functions.

Regarding sparsified readout, the VIPIC detector will increase data throughput by only reading out those pixels receiving an x-ray hit during the exposure window. The basic raw data is a simple list of hit times and pixel locations. The detector dispenses with the standard notion of an exposure producing a new imaging regime optimized for low-signal techniques.

Regarding high-time resolution, the detector can specify the interaction time of an x-ray to better than for example, 1-10 microseconds. Standard area detectors simply record the location of the interaction, and the temporal resolution is determined by the exposure time that can be as short as less than 1 microsecond.

Regarding real-time calculation of auto-correlation functions, the final result of an XPCS measurement is an auto-correlation function. The VIPIC detector includes novel readout electronics capable of real-time calculation of the auto-correlation functions. A practical detector for this purpose demands a large pixel count in order to acquire sufficient events to give good statistics.

The disclosed example embodiments discussed and illustrated herein cover various aspects of a very new technology of 3D integration that allows for an enhanced functionality in a hybrid pixel detector (e.g., a low noise, sparsified readout with a time stamp providing less than 10 microseconds precision). 3D integration comprises a method in which two separate CMOS circuits are bonded together, mechanically and electrically, to provide greater functionality than would be possible in a single CMOS layer. VIPIC utilizes a two-layer ASIC which is directly bonded to a pixilated silicon sensor, and the resulting sensor/ASIC hybrids is bump bonded to a ceramic or other material-based readout board. The unique hybrid structure does not require traditional wire-bonds for readout of the ASICs, eliminating many of the coverage gaps associated with traditional hybrid pixel area detectors.

Note that a TSV (through-silicon via) is a vertical electrical connection (via) passing completely through a silicon wafer or die. TSVs can be utilized to create 3D packages and 3D integrated circuits, compared to alternatives such as package-on-package, because the density of the vias is substantially higher, and because the length of the connections is shorter.

A readout board can contain, for example, a 7×7 array of VIPIC's and the FPGAs interconnection translates to an extremely complex layout.

FIG. 1 illustrates a side cut-away view of a single module 3D integrated edge detector apparatus 10, in accordance with an example embodiment. The apparatus 10 depicted in FIG. 1 can function as a 3D integrated edgeless pixel detectors and generally includes a cooling plate 12 disposed adjacent to a group FPGA (Field-Programmable Gate Array) devices 14, 16, 18, 20 configured on a substrate 24 in association with a connector chip 22 which in turn is electrically connected to a lead wire 23 for connection to other electrical devices and components.

In some example embodiments, the substrate 24 can be an LICC (Low Temperature Co-fired Ceramic). The substrate 24 is noted as being a "PCB or other ceramic board" in FIG. 1. ASIC devices 34, 36, 38, 40 can be located below the substrate 24 at positions corresponding approximately to the locations of the respective FPGA devices 14, 16, 18, and 20. The ASIC devices 34, 36, 38, 40 can form an ASIC array, and the FPGA devices 14, 16, 18, and 20 can form an FPGA array. The ASIC devices 34, 36, 38, and 40 are located on an oxide layer 28 that in turn is located above a high resistivity (HR) sensor slab/wafer 30. The ASIC devices 34, 36, 38, and 40 can form part of a 3D ASIC device.

In an example embodiment, a design methodology for configuring 3D integrated edgeless pixel detectors with in-pixel processing can be implemented, which utilizes commercial CAD-EDA (Computer Aided Design-Electronic Design Automation) tools. A large area 3-tier 3D detector with one sensor layer, such as the sensor layer 30, and two ASIC layers containing one analog and one digital tier can be configured for x-ray photon time of arrival or energy measurement and imaging. The digital tier (or digital tiers) discussed herein is edgeless and comprises an array of physically indivisible edgeless sub-chips mating with corresponding analog tier or analog tiers) that can be edgeless.

In some example embodiments, a full custom analog pixel can be, for example, 65 µm×65 µm. Such an analog pixel can be connected to a sensor pixel of the same size on one side, and on the other side can offer approximately 40 connections to the virtual digital pixel. The analog tier contains repeatable blocks, thus can be configured with no peripheral functional blocks. Hence, the active area extends to the edge of the detector. This arrangement can be achieved in a straight manner utilizing identical analog block arranged in an array or by utilizing a few flavors of almost identical analog pixels (e.g., with minimal variation in layout), forming together an array, to allow for minimum biasing blocks to be placed within pixels.

Figure 15:
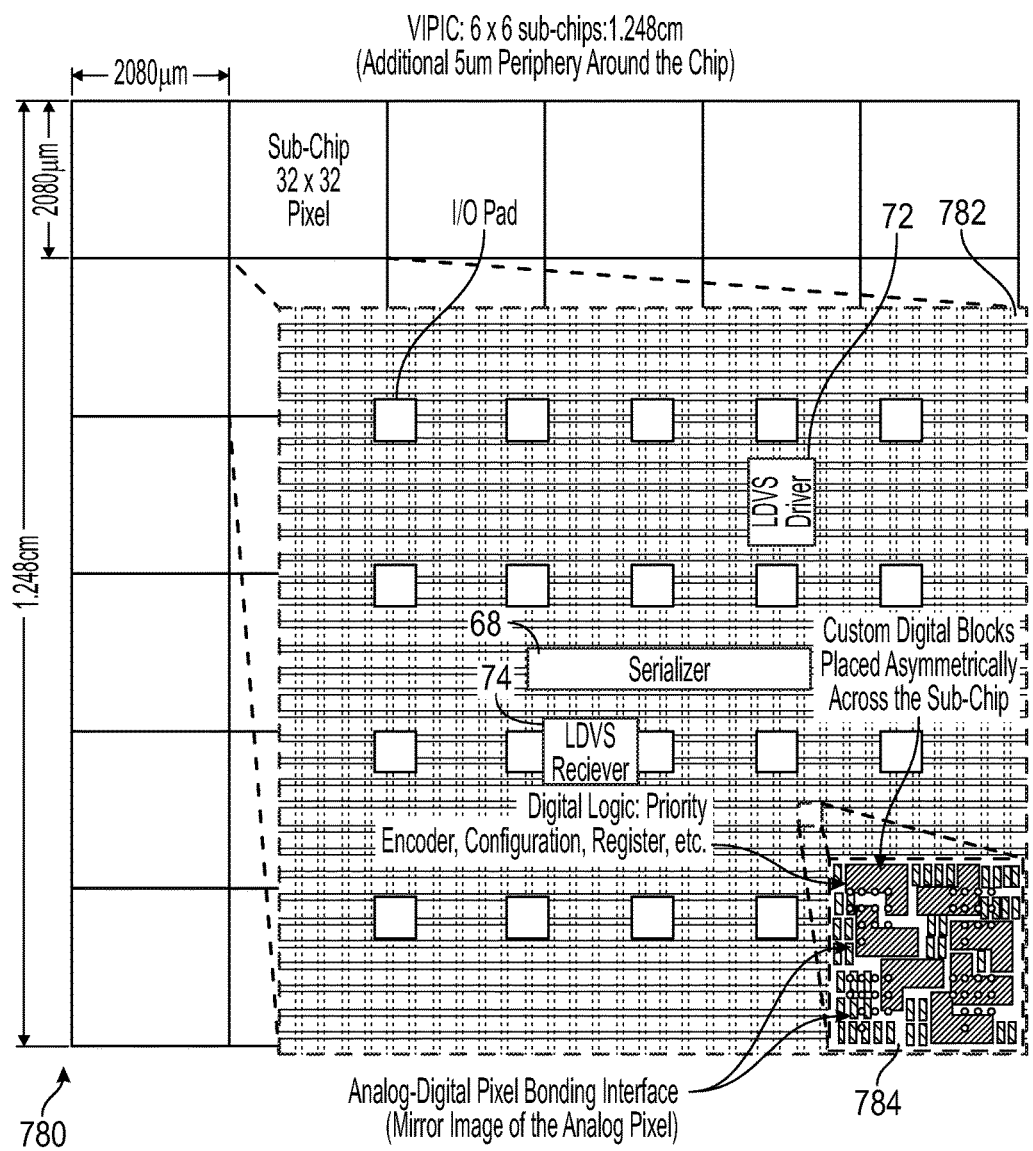
FIG. 15 illustrates a layout of a VIPIC in a 6×6 sub-chip arrangement with a zoom-in of a single sub-chip back side with bump bonding pads and one analog pixel, in accordance with an example embodiment.

On the digital ASIC tier, a 32×32 edgeless array without any peripheral functional blocks, for example, constitutes a sub-chip. Such an example sub-chip can be an indivisible unit, which is further arranged in, for example, a 6×6 array to create an entire 1.248 cm×1.248 cm ASIC, hosting approximately 1 million of pixels, as shown in FIG. 15.

Each chip can include 720 bump-bond I/O connections on the back of the digital tier to the ceramic or other material-based PCB or substrate such as, for example, the LTCC substrate 34 shown in FIG. 1. The entire analog tier power and biasing can be conveyed through the digital tier from the PCB or ceramic substrate 24.

For example, 1024 pixels within a digital sub-chip array offer a variety of full custom, semi-custom and automated, timing-driven functional blocks placed and interconnected together. The disclosed methodology can thus utilize a modified digital on-top implementation flow to not only harness the CAD-EDA tool efficiency for timing and floor-planning, but also to maintain designer control over compact parasitically-aware layout.

Some example embodiments can further employ, for example, the Cadence CAD-EDA platform. It can be appreciated, however, that none of the embodiments are limited to this tool, which is discussed herein for exemplary purposes only and is not a limiting feature of the disclosed embodiments.

Figure 2:
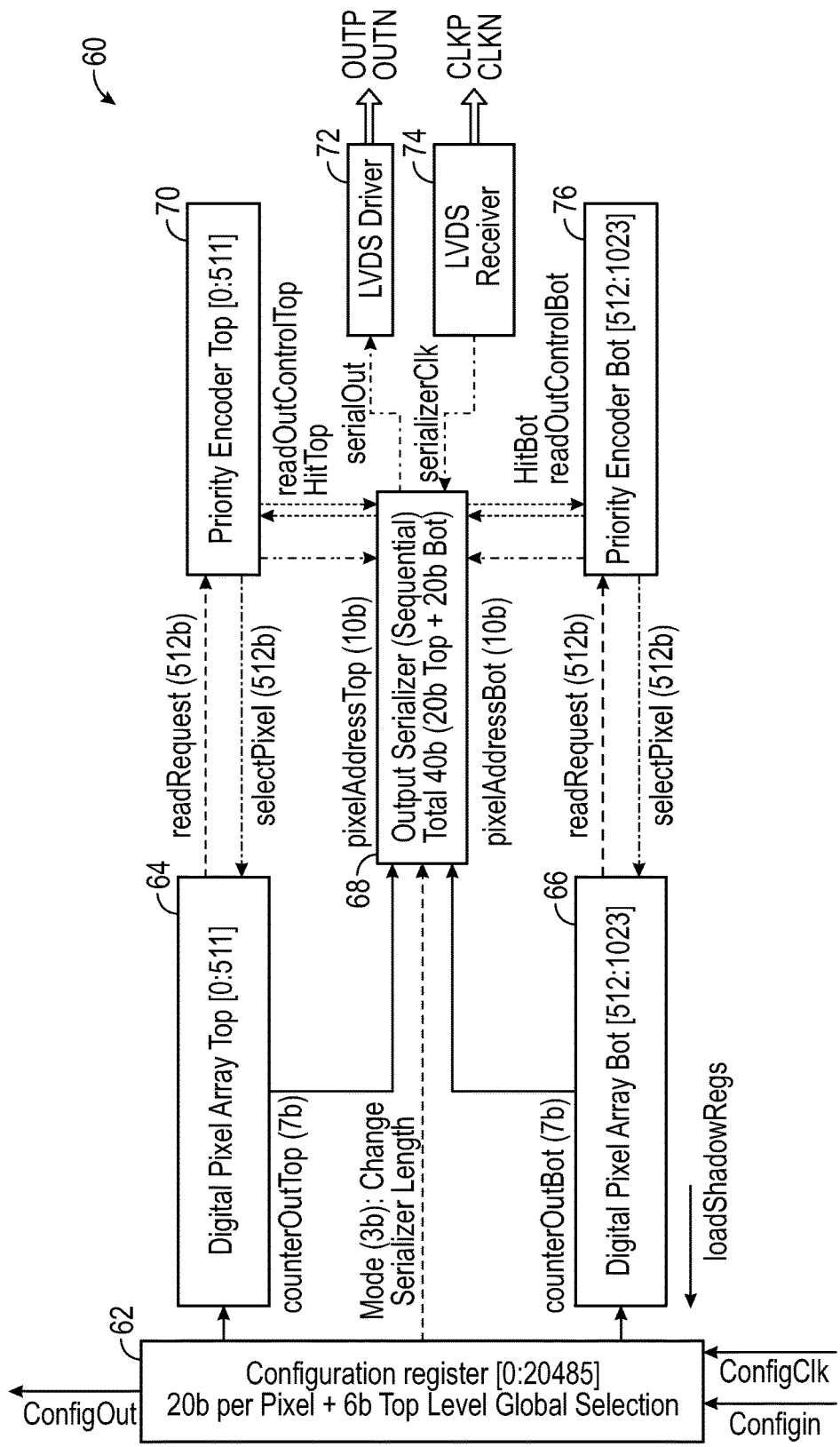
FIG. 2 illustrates a block diagram of a digital sub-chip, in accordance with an example embodiment.

FIG. 2 illustrates a block diagram of a digital sub-chip 60, in accordance with an example embodiment. The sub-chip functionality 60 shown in FIG. 2 includes a configuration register 62 that provides output to a digital pixel array (top) 64 and a digital pixel array (bottom) 66 as well as the analog pixel matrix (not shown). The configuration register 62 can also provide output to a sequential output serializer 68. The digital pixel array (top) 64 can also send and receive data from a priority encoder (top) 70 which in turn can send and receive data to and from the output serializer 68. A standard LVDS (Low-Voltage Differential Signaling) or low-power supply LVDS derivative driver (LVDS-like) 72 can receive data output from the output serializer 68 to send data further off chip. An LVDS or LVDS-like receiver 74 can send data to the output serializer 68. A priority encoder (bottom) 76 can send and receive data to and from the output serializer 68 and can also send and receive data to and from the digital pixel array (bottom) 66.

The digital pixel processing module (pixel back-end module) is composed of two blocks. The first one is the hit holder block (822) and the second one is the hit counter block (824) as shown in FIG. 17 and FIG. 21.

Figure 17:
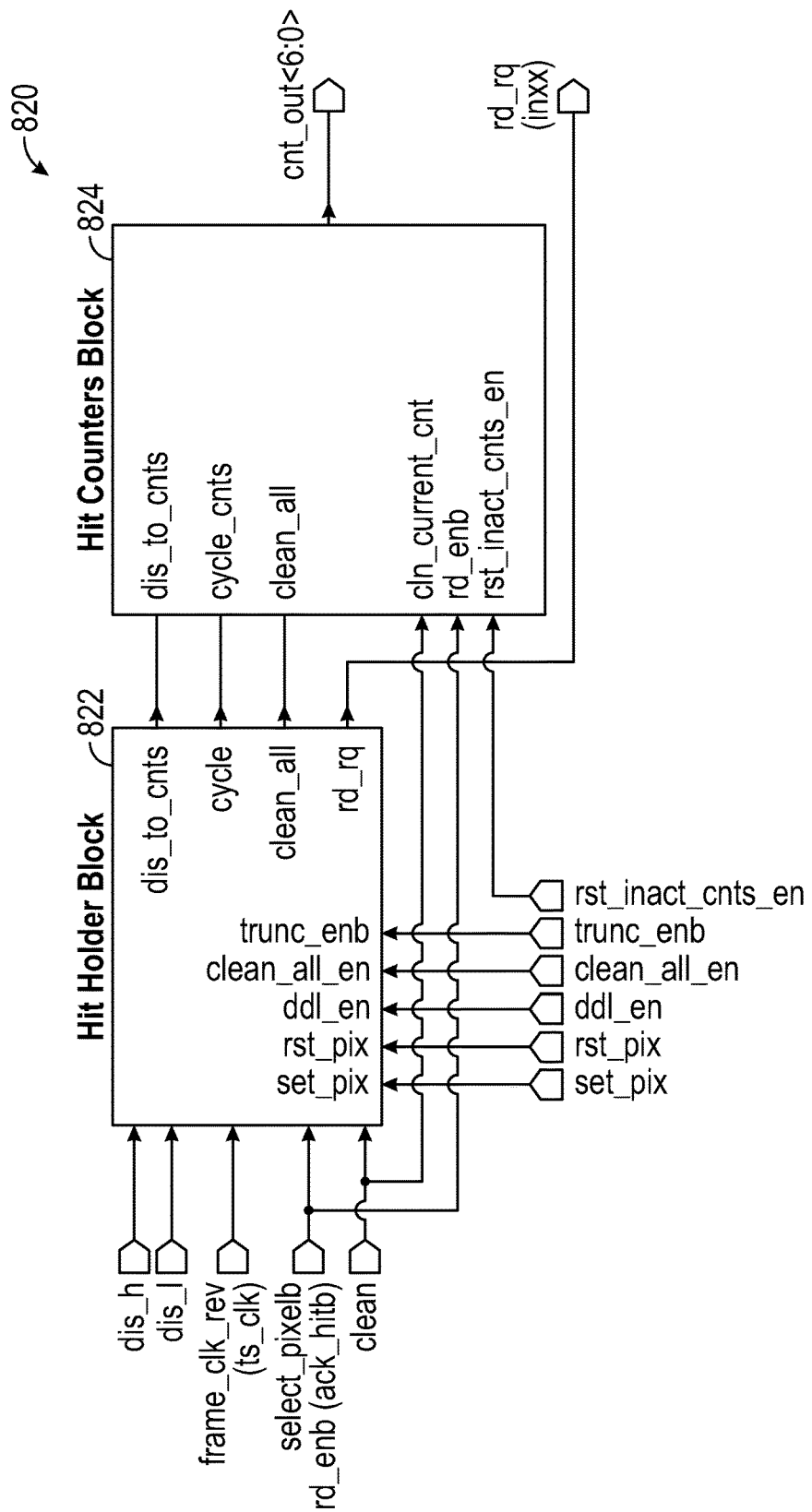
FIG. 17 illustrates a logic diagram of the electrical layout of a pixel digital processing circuit that includes a hit holder and hit counters blocks, in accordance with an example embodiment.

The hit holder block (i.e., the hit holder 822) as shown in FIG. 17, receives signals from comparators from the analog pixel, on the digital side, and it also receives the modified signal that defines a change of time frames (frame_clk_rev), the signal that selects a pixel for readout (select_pixelb—called also rd_enb), the reset signal (clean), and a few signals coming from the configuration register that set the options in the functionality of the hit holder block (set_pix, rst_pix, ddl_en, clean_all_en, trunc_enb, rst_inact_cnts_en). The role of the hit holder block is to register hits, to interface to the hit counter block for counting the hits, and to handshake with the priority-encoder-based system that orchestrates the readout of pixels (sending data to the serializer).

The hit counter block (i.e., the hit counter(s) 824) as shown in FIG. 17 is responsible for counting pulses that are received from the hit holder block and for sending the results of counting to the serializer block on the readout buses. Data from the serializer are sent off the chip. The hit counter block receives the pulse signals corresponding to hits that need to be counted (dis_to_cnts), the signal requesting cycling between the counters (cycle_cnts), and the reset signal (clean_all) from the hit holder block. It also receives the signal that selects a pixel for readout (select_pixelb—called also rd_enb) and the reset signal (clean). Additionally, one signal from the configuration register (rst_inact_cnts_en) sets the optional functionality of the hit-counter block. The pulses presented by the hit holder block to the hit counter block for counting are the time-adjusted pulses of the discriminators. The hit counter block contains two ripple counters that count in the Gray code and some logic circuitry that controls the operation of the counters.

In some example embodiments, the operation of the digital pixel processing module (pixel back-end module) can be defined, for example, as 7 bits that are available to every pixel, as follows:
set_pix='1' (high), then a pixel has always a hit to report; a pixel is set when set_pix is high and rst_pix is low (programmed locally)
rst_pix='1' (high), then a pixel has never any hit to report; a pixel is reset when rst_pix is high and set_pix is low (programmed locally)

The setting and resetting of a pixel is an exclusive function as follows:
set='0'&rst='0' means a normal operation in the sparsified readout mode, and
set='1'&rst='1' means an operation in the imaging readout mode, set='1'&rst='0' means a pixel is permanently set, and set='0'&rst='1' means a pixel is permanently reset.

Figure 23:
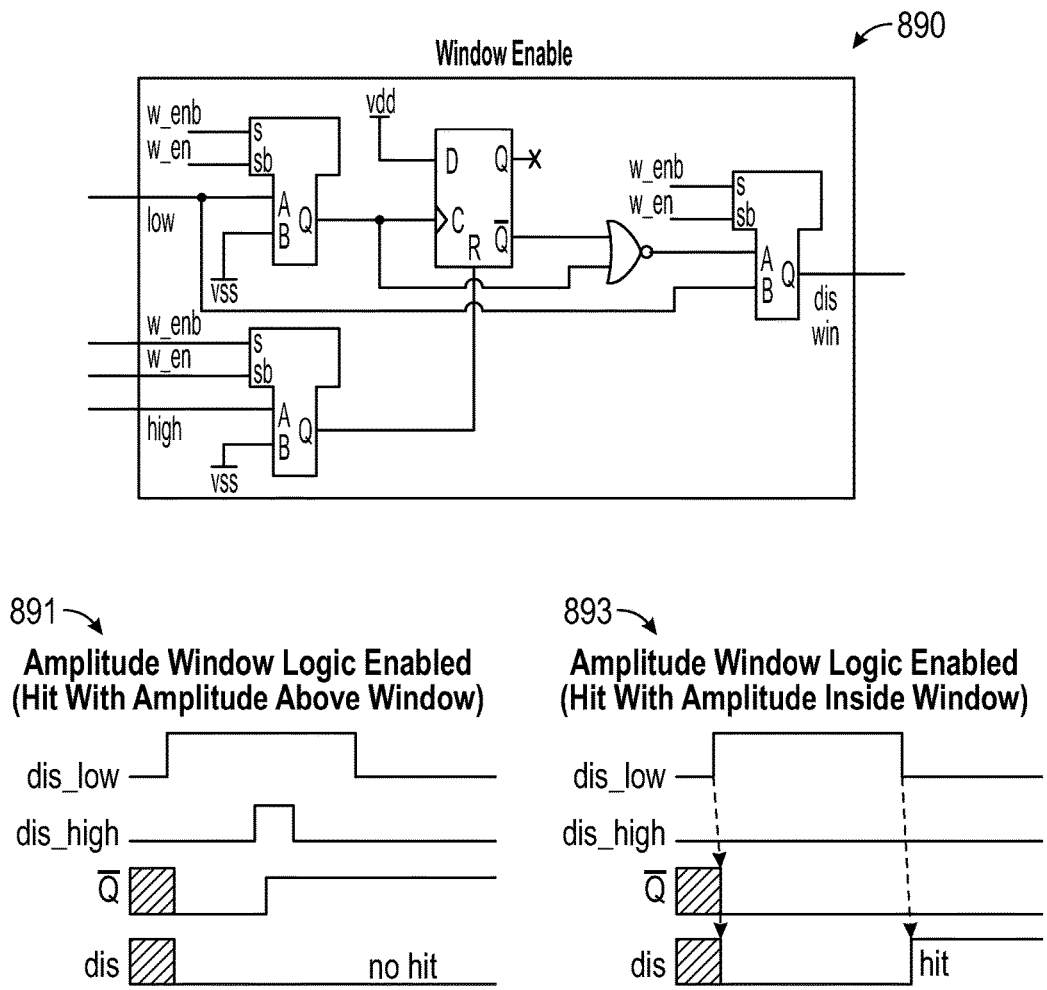
FIG. 23 illustrates a logic diagram depicting the electrical layout of a discriminator amplitude window circuit with its enable circuit and timing diagrams depicting its operation for two examples of signal amplitudes, in accordance with an example embodiment.

The enable energy $E_{photon}$ (amplitude) discrimination window 890 as shown in FIG. 23 (programmed globally) can be determined as follows:
if ddl_en='1', then a hit is registered when dis_l<$E_{photon}$<dis_h, registration of a hit occurs on the falling edge of the dis_l signal if no dis_h signal was activated;
if ddl_en='0', then a hit is registered when dis_l<$E_{photon}$, registration of a hit occurs on the raising edge of the dis_l signal regardless of the dis_h signal;
clean_all_en (programmed globally): modifies the scope of the global clean signal;
if clean_all_en='1', then clean='1' removes all pixels from being presented to the sparsification circuit for readout, resets current hit acquisition and resets both pixel counters in all pixels;
if clean_all_en='0', then clean=1 removes all pixels from being presented to the sparsification circuit for readout, and reset counters that were read out or should be read out in the current time frame in all pixels but does not affect current acquisition of hits;
trunc_enb='0', then, when a time frame changes with a rising edge of the frame_clk_rev signal, the priority encoder is presented with newly acquired hits only;
if trunc_enb='1' then, when a time frame changes with a rising edge of the frame_clk_rev signal, the priority encoder is presented with newly acquired hits added to the hits that were not read out before the last time frame change (accumulation of hits for readout) (programmed globally);
rst_inact_cnts_en='1', then, after switching of time frames, a counter that is cycled in this new time frame to count the incoming hits is reset automatically prior to accepting any new hits (programmed globally);
if rst_inact_cnts_en='0', then an automatic resetting of a counter is deactivated and a counter that is cycled in a new time frame to count the incoming hits does not undergo resetting, so new hits are added to the counts already stored in a counter.

The hit registration is pipelined. At the rising edge of frame_clk_rev signal, which indicates a change of a time frame, the registered hits in the current time frame are moved from the first stage of the pipeline shown in FIG. 18 to the second stage of the pipeline illustrated in FIG. 19 for readout. Simultaneously, registering of new hits in the new time frame begins without any dead time.

Figure 18:
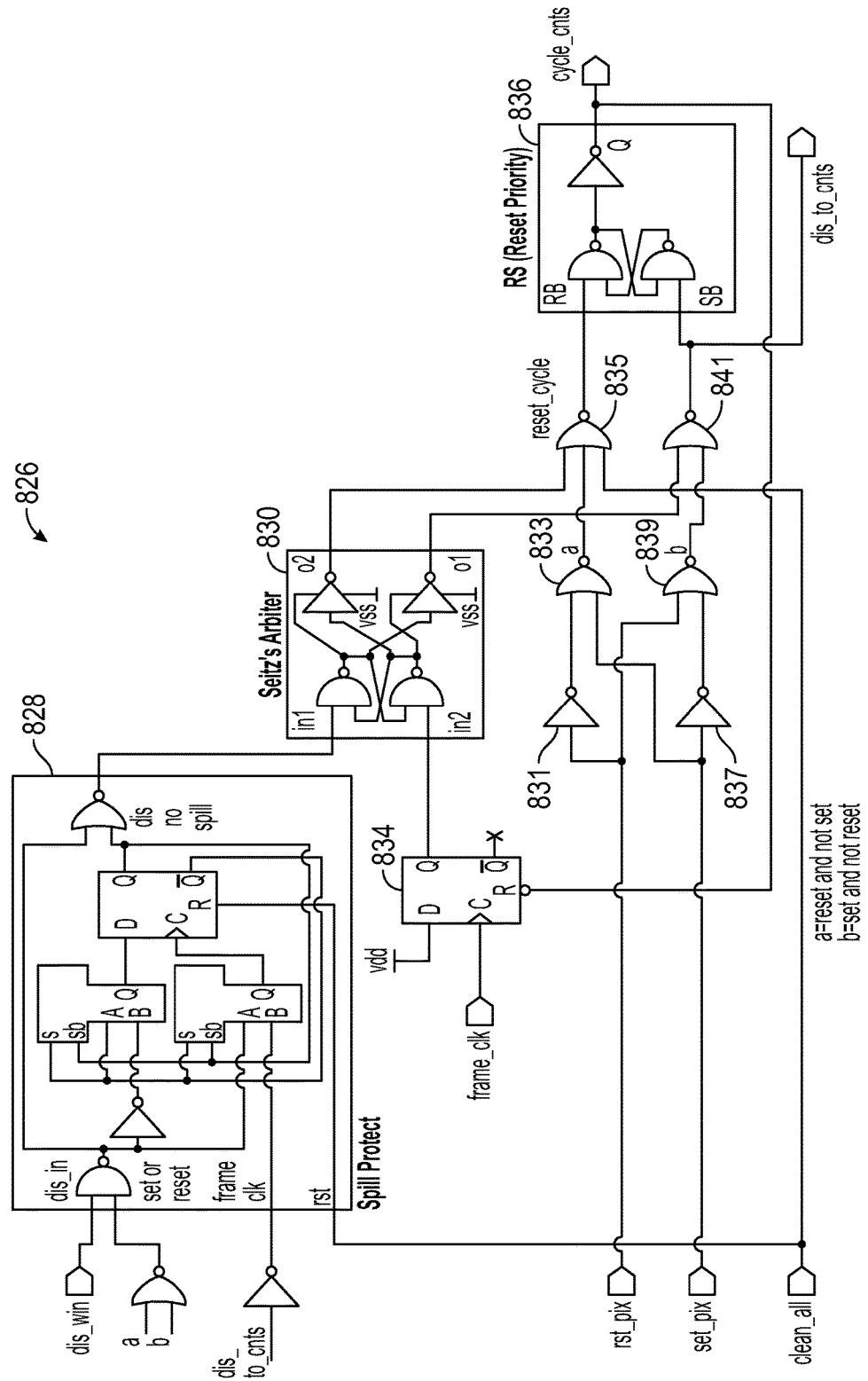
FIG. 18 illustrates a logic diagram of the electrical layout of the first stage of the hit-holder block in the hit processor unit that is the first stage of the pipeline registering hits and presenting them for readout, in accordance with an example embodiment.
Figure 19:
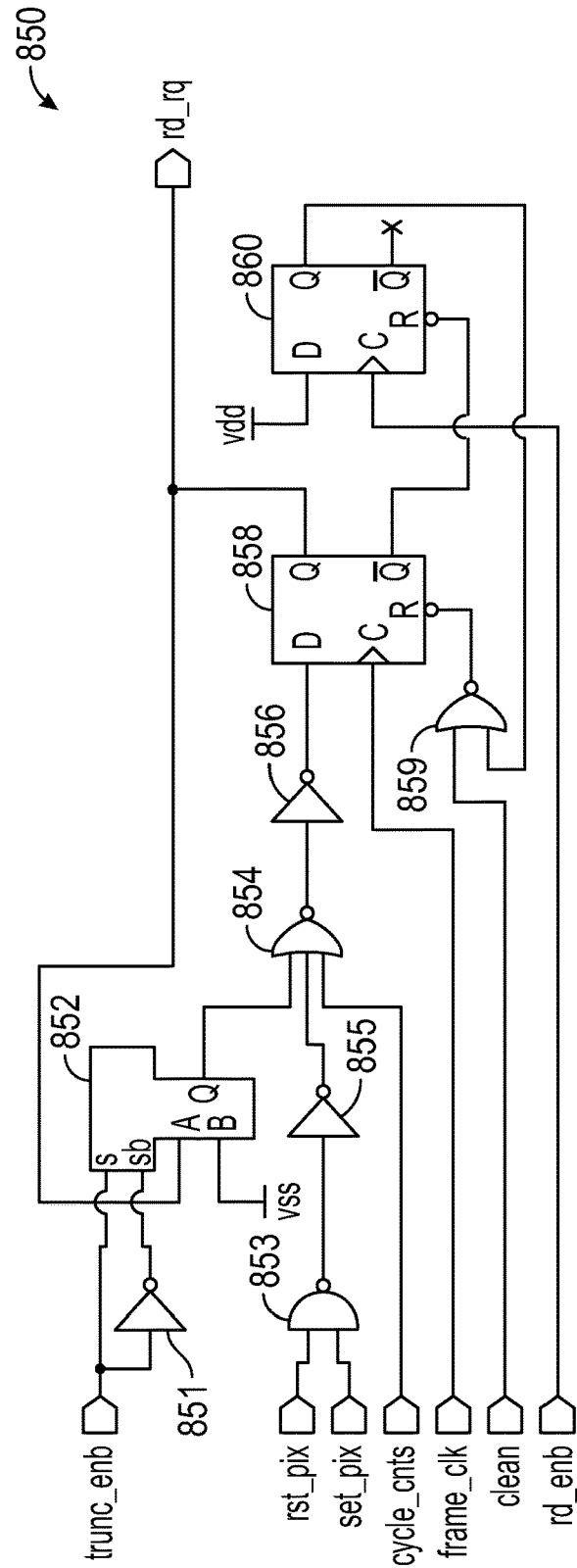
FIG. 19 illustrates a logic diagram of the electrical layout of the second stage of the hit-holder block in the hit processor unit 820 in FIG. 17 that is the second stage of the pipeline registering hits and presenting them for readout, in accordance with an example embodiment.

Detection of a at least one hit in a current time frame is known through the set state of the RS flip/flop 836 in FIG. 18, and presence of at least one hit in the previous frame for a readout is known through the set state of the D flip/flop 858 in FIG. 19.

Changing of time frames may sometimes lead to ambiguities of registering hits. Hence, a dedicated mechanism of avoiding double counting of hits at the transitions of the time frames is introduced. When the pixel back-end detects a hit signaled by the high state of the discriminator, which coincides with the time frame change, it makes sure that these hits are registered in the "old" time frame.

Additionally, low-probability cases of coincidences between the edges of the time frame signal and the rising edge of the discriminator signal can be resolved by utilizing the Seitz's arbiter circuit 830 shown in FIG. 18, which selects between registering of a new hit or changing to a new time frame first.

A full frame-imaging mode can be implemented by keeping the register D flip/flop 858 in FIG. 19 and ON that forces a pixel signaling its occupancy to be read out regardless of having any hit actually counted.

Registration of hits is asynchronous, thus pixel counters need to be ready for receiving new hits as soon as the frame changes. Counters in pixels that were read out can be reset immediately after an access to a pixel is over and the readout moves to the next pixel in the priority hierarchy. This operation is incorporated within the pixel readout process as a part of the hit_counters block. However, the duration of a time frame may be chosen, such that sometimes not all pixels with valid hits can be read out before the frame changes.

The pixel hack-end circuitry includes global resetting of the pixel counters that can be accomplished just before switching to the new time frame. However, a mechanism has been implemented that allows avoidance of sending global signals to the pixels and so that dead time related to the resetting of counters can also be avoided.

Additionally, counters in pixels that do not receive hits are not toggled between counting and readout states at every change of time frames. This approach was adopted in order to reduce the switching activity in the chip. With the implemented solution, counters are toggled only after detection of the first hit in the new time frame.

A counter 870 in FIG. 20 will continue counting hits until the end of the time frame after, which it is switched to the readout phase. If it is read out, it will be reset and will remain in this empty state until the next hit gets detected in one of the following time frames by a pixel to which this counter belongs.

However, if it was not reset immediately after readout, it will be reset in the new time frame, automatically right at the beginning of the time frame. In this new frame, if a new hit coincides or comes right after the frame change occurred, the new hit needs to be registered immediately and simultaneously with resetting of the counter. In such a scenario the toggling counter will not be reset to zero, instead its least significant bit is set to one. This method of resetting the hit counters 870 in FIG. 21 and FIG. 20 avoids losing new hits coming concurrently with the reset process. Thus, it provides the required dead-time-less operation of the pixel back-end.

The first hit in a new time frame results in setting of the reset dominant RS flip/flop 838. Setting of this flip-flop causes the counters cycle in the next time frame. If the counter was previously in readout configuration, the counter is moved to counting and the counter that was previously counting is moved to readout.

The setting signal of the RS flip/flop 838 (although not doing anything new to the RS flip/flop) can also be utilized for incrementing counters for every incoming hit by sending the dis_to_cnts signal to the hit counter block. The dis_to_cnts signal is fed back to the spill protect logic 828 in FIG. 18 and FIG. 22 at the same time, where it resets the D flip/flop 842—number needs to be added, previously set by a rising edge of the discriminator signal dis_win.

The output of this D flip/flop 842 gates the discriminator signal. By doing so, the resulting signal that is used for incrementing the counter is zeroed and thus its duration is very short. The duration is defined by the gate delays and it is designed to be long enough to allow the counter to be incremented.

The RS flip/flop 836 is reset at the rising edge of the frame_clk signal or additionally, "clean all" signal can reset it as well, while the state of the RS flip/flop 836 is shifted to the second stage of the pipeline to D flip/flop 858 to request readout of a pixel.

The frame_clk is latched in a D flip/flop 834 and then the latched result is arbitrated with the discriminator signal using a Seitz's arbiter 830. When a rising edge of the frame_clk coincides with the arrival of a hit, the Seitz's arbiter decides about the order of operation, i.e., change of the time frames or still registering of a hit. The latching of the frame_clk allows unblocking of the Seitz' arbiter after the change of time frames takes effect to allow registering of hits.

If a hit is arbitrated first (e.g., as facilitated by the Seitz's arbiter circuit 830 shown in FIG. 19) resulting in its occurrence before the rising edge of the frame_clk, another pulse can be sent to the counter to increment its value still in the current time frame. This pulse can be truncated to a duration of about 1 ns by the spill over protection logic 828 in FIG. 18 and FIG. 22, following which the latched frame_clk signal generates an edge on the Seitz's arbiter output. Short duration of the truncated discriminator signal guarantees insignificant delay of the frame_clk edge seen by a pixel. This results in transferring the contents of the RS flip/flop 836 to the second stage of the hit holder block pipeline, followed by resetting the RS flip/flop 836 and then by cycling of counters.

Once the RS flip/flop 836 is reset, the RS flip/flop 836 triggers the reset of the D flip/flop 834 used for latching the frame_clk, which unblocks the Seitz's arbiter circuit 830 shown in FIG. 18 for unaffected transferring of discriminator pulses until the next edge of the frame_clk. An arrival of a new hit sets the RS flip/flop again and initiates registration of a new sequence of hits. However, if there are no hits until the next rising edge of the frame_clk signal, this part of the circuit remains inactive.

If the latched frame_clk signal is arbitrated first, resulting in its occurrence on the output of the Seitz's arbiter 830 before the hit. This results in transferring the contents of the RS flip/flop 836 to the second stage of the hit holder block pipeline, followed by resetting the RS flip/flop 836 and by cycling of counters. Once the RS flip/flop 836 is reset it triggers the reset of the D flip/flop 834 used for latching the frame_clk, which unblocks the Seitz's arbiter circuit 830 for unaffected transferring of discriminator pulse that is virtually kept on hold, and, consecutively, for other incoming discriminator pulses. The hit that has been kept on hold is registered in the new time frame. The delay of keeping a hit on hold is extremely small, i.e., on the order of 1 ns, thus a hit will not be lost. Losing of a hit may only result from a discriminator returning to the quiescent state that may occur for a hit barely crossing a threshold level thus it is insignificant. An arrival of a new hit sets the RS flip/flop 836 again and initiates registration of a new sequence of hits.

The second stage of the hit registering pipeline in the hit holder block is principally designed to interact with the priority-based-sparsification engine for reading out of the pixel data. The high state of the rd_rq line signals the priority-encoder that a pixel has data to transmit. The rd_rq signal is assessed at every time frame change. The rd_rq or the logic level '0', depending on the trunc_enb configuration bit, is ORed with the product of rst_pix and set_pix and cycle_cnts. At every time frame change the output of the OR gate is latched in the D flip/flop 858. It is set when the following occurs:

1) a pixel is configured in the imaging mode, i.e., the set_pix and rst_pix configuration bits are set both high (it is worth mentioning that some pixels in the matrix can be configured in the imaging mode and some in the sparsification mode simultaneously),
2) the RS flip/flop 836 in the first stage of the hit registering pipeline is also high, i.e., at least one hit was registered in the current time frame, regardless of the state of the trunc_enb bit,
3) the rd_rq signal was high and a pixel was not read out in the current time frame and the state of the trunc_enb is low, such a pixel is given a second chance to be read out.

The rd_rq signal can be reset either by the global clean signal or by the rising edge of the rd_enb signal with help of an auxiliary D flip/flop 860. In both cases, a pixel, in which the rd_rq signal is deactivated cannot be selected for readout.

The rd_enb signal is a means of carrying out hand shaking between the pixels and the priority-encoder. A pixel, which is selected for readout, has its rd_enb go low. This low level, detected by the hit counter block, results in unblocking of the bus drivers and the counter values are sent to a serializer for off chip readout. At the same time, the drivers of all other pixels are kept in the high-Z states. Simultaneously, the priority encoder generates a binary address of the selected pixel that is latched in the serializer.

Note that clean signal is the global reset signal for the hit processor. The functionality has been designed such that it is not required for the normal operation of the chip and is only a troubleshooting feature. The global clean_all_en configuration register bit chooses the scope of the reset action.

The hit counter block receives three signals from the hit holder block. These signals are dis_to_cnts in to increment a counter, cycle_cnts to cycle counters, and clean_all to perform reset of both counters. It also receives the global clean signal, one bit (rst_inact_cnts_en) from the configuration register, and the rd_enb signal from the priority encoder.

The counters are cycled at time frame changes and after every readout, a counter, whose state was sent down to the serializer, is reset.

The hit counter block (e.g., the hit counter(s) block 824 shown in FIG. 17) can also implement an alternate mechanism for automatic resetting of counters in pixels that did not make through to the readout due a short time frame. This alternate mechanism can be activated when the rst_inact_cnts_en bit is set. If this bit is not set, resetting of pixels that were not selected for readout does not occur and counting of new hits starts from the values already stored in the counters.

Figure 21A:
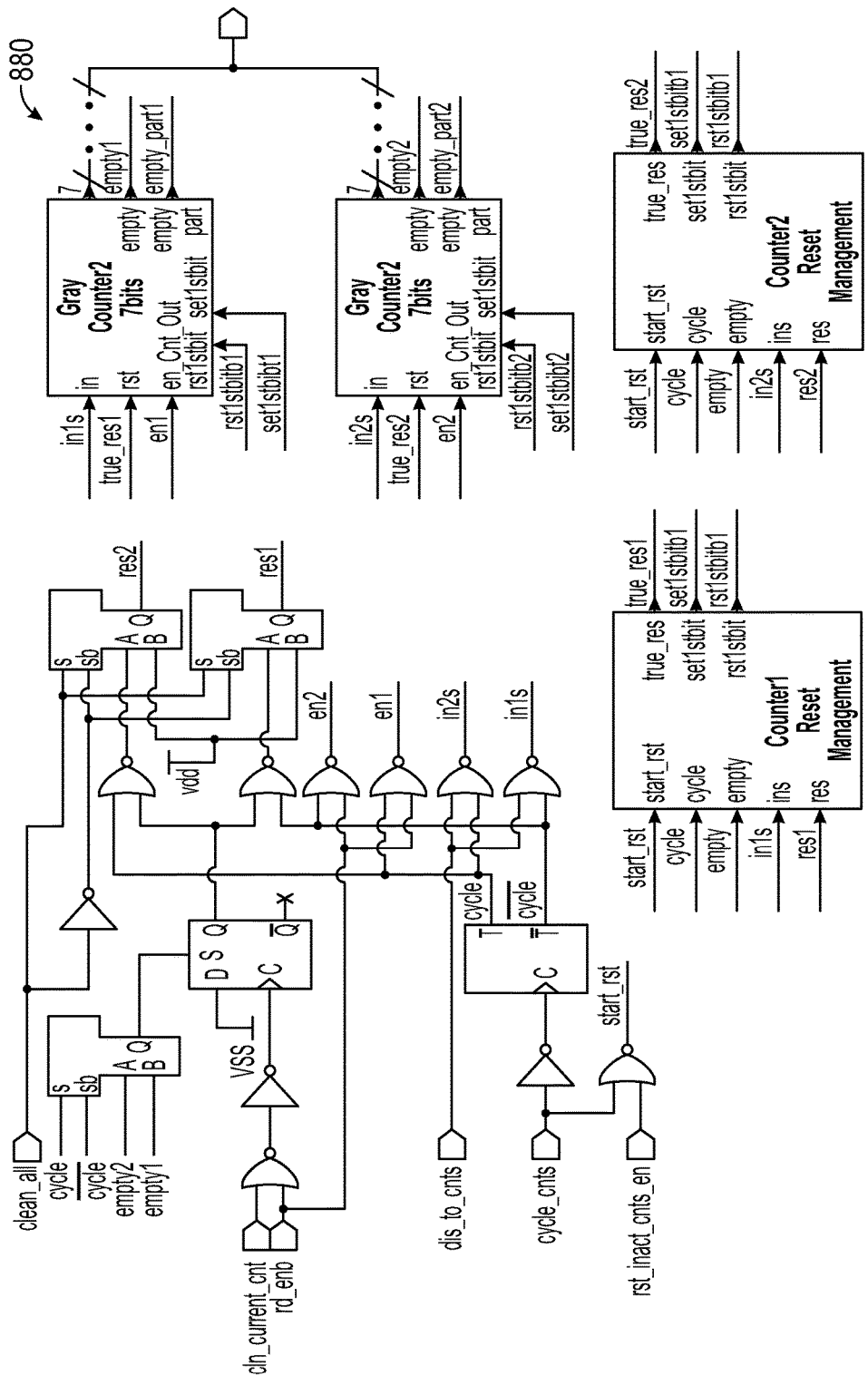
FIGS. 21A to 21B illustrate a logic diagram depicting the electrical layout of digital pixel circuitry of the hit counters block with a timing diagram depicting alternate use of counters for counting and reading out, in accordance with an example embodiment.
Figure 21B:
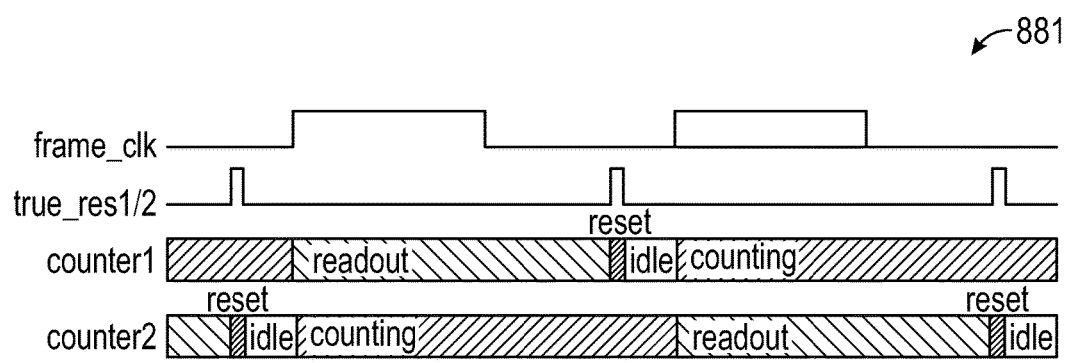
Figure 24:
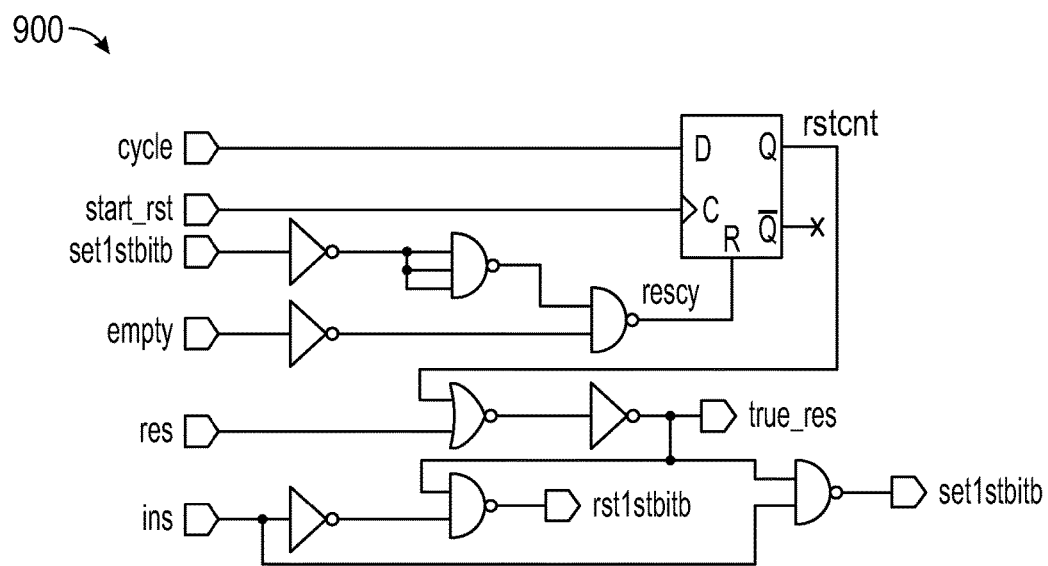
FIG. 24 illustrates a logic diagram depicting the electrical layout of a set first bit of a counter circuit, in accordance with an example embodiment.

The hit counters block 824 shown in FIG. 17 can contain two counter reset management blocks 900 and 903 as shown in FIGS. 21A-2B (and also indicated by the reference numeral 900 in FIG. 24). Every falling edge of the cycle_cnts signal that is exchanged between the hit holder block 822 and the hit counters block 824 that occurs at switching to a new time frame, under the condition that a pixel collected some hits in the current time frame, causes cycling of the counters. Simultaneously, but prior to the cycling of counters, the state of the cycle signal, i.e. the output of the toggle flip/flop 885 in FIGS. 21A-21B, is latched in a resettable D flip/flop 901 in FIG. 24, producing the rstcnt signal. The high state and the low state will be latched as the rscnt signal for a counter that was being readout and is not empty and for a counter that was counting, respectively in the D flip/flop 901 of the appropriate counter reset management block.

Only the high state of the rscnt may initiate the counter resetting action. If a counter in a pixel is already empty, for example, as a result of an automatic reset after a readout, the rstcnt output signal of the D flip/flop 901 in FIG. 24 will permanently be low due to the low state of the empty signal. Hence, the reset process will not take place on an already empty counter. The rstcnt signal is summed with the res signal and the true_res signal is created that is used for resetting all but the least significant bit of a counter. Logical summing of the rstcnt signal with the res signal allows the use of the same path for the resetting of a counter after switching to a new frame as that from the clean signal or reset after readout.

The least significant bit of a counter 870 in FIG. 21 and FIG. 20 undergoes either reset (rst1stbitb goes low) or set (set1stbitb goes low), depending on whether a given reset process occurs automatically after reading out of the counter or is required after the change of time frames and there is no new hit arriving simultaneously with the change of time frames or a new hit arrives simultaneously with the change of frames. For the latter, the ins signal, indicating arrival of a new hit, is high. Thus, the least significant bit of a counter needs to be set, while all other bits are reset at the same time. The reset process of a counter concludes when the D flip/flop 901 in FIG. 24 is reset. This is achieved with either a counter becoming empty (high state of the empty signal) or when the set1stbitb, delayed by a few gate delays, resets the D flip/flop 901 in FIG. 24.

An OR gate 871 in FIG. 20 is located inside the Gray-code counter block 870 in FIG. 21 and FIG. 20 and its output, when it is high, indicates that a given counter is empty. Gray-code assures that this OR gate never outputs glitches, while a counter is counting hits.

The multiplexor, composed of NOR gates 991, 992, 993, 994, 995, and 996 in FIG. 21A can be controlled by the cycle signal that determines which counter is currently used for reading out and for counting in every time frame and distributes functions of counting of hit pulses (in1s, in2s in FIGS. 21A-21B), enabling for readout (en1, en2 in FIGS. 21A-21B) and resetting (res1, res2 in FIGS. 21A-21B) accordingly.

Figure 20A:
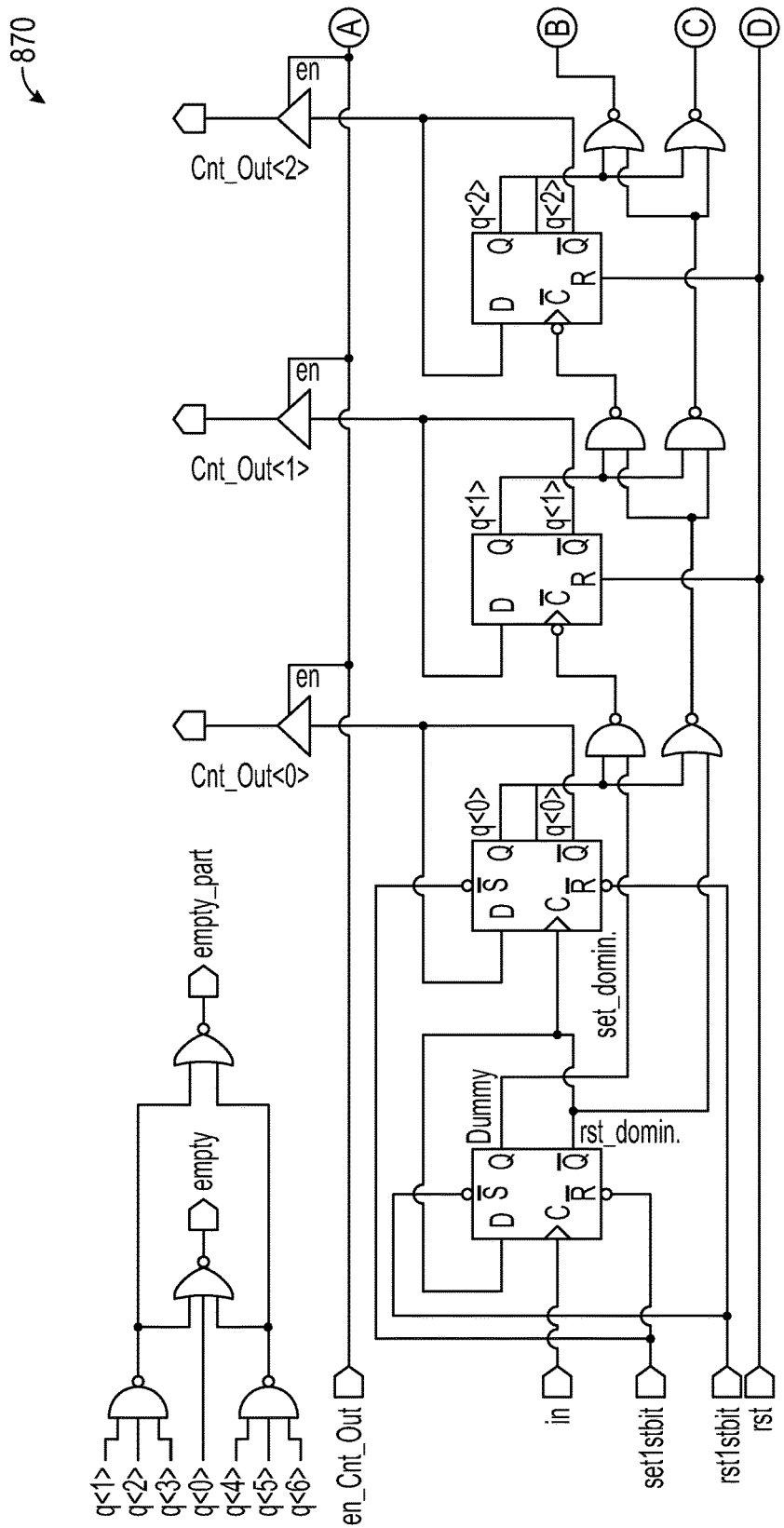
FIGS. 20A to 20B illustrate a logic diagram depicting the electrical layout of a gray-code counter with its empty state monitoring logic, in accordance with an example embodiment.
Figure 20B:
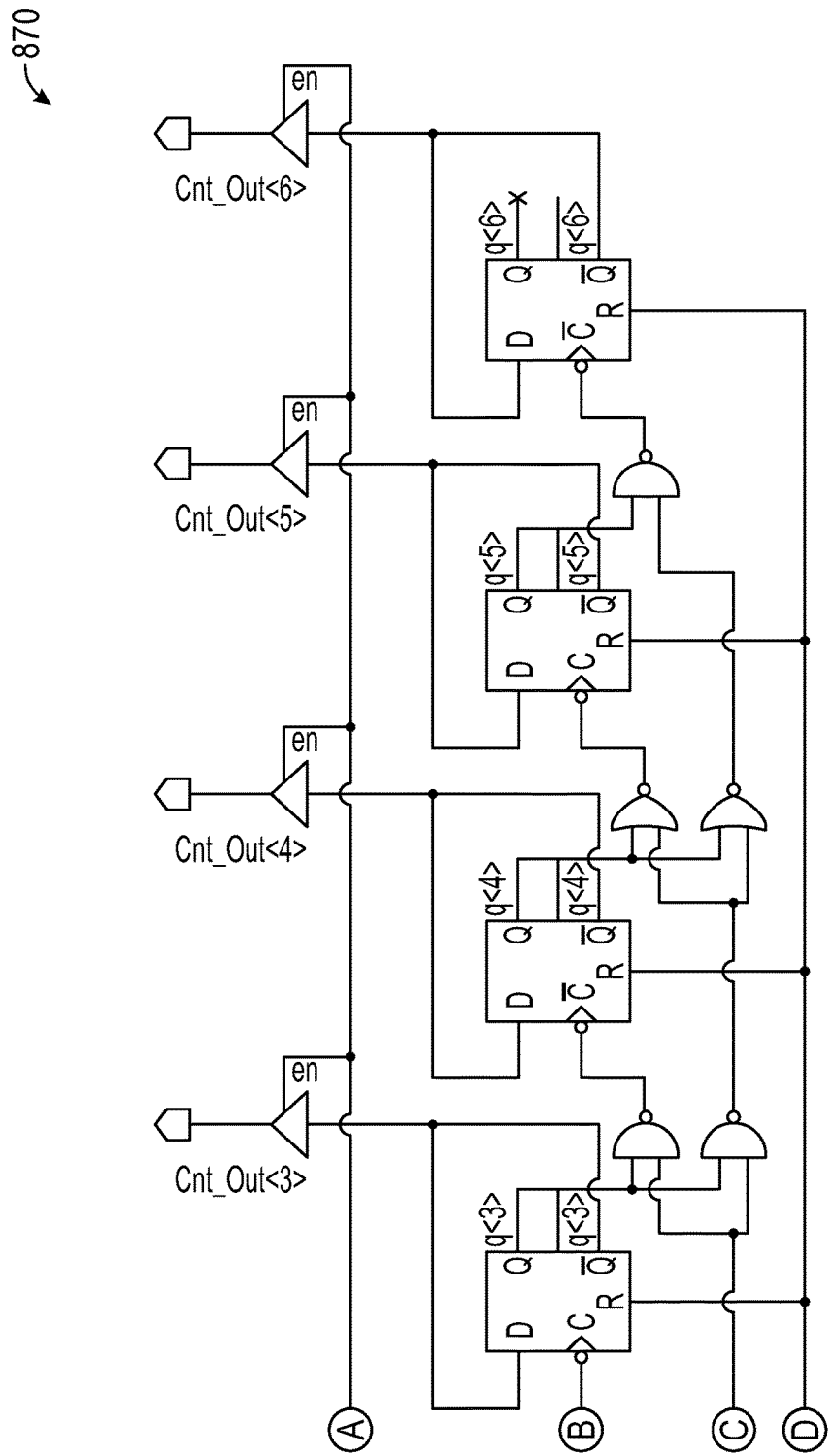

The hit counter block 824 shown in FIG. 17 and in more detail as the hit counter 824 in FIG. 21A contains two 7-bit, gray code ripple counters (e.g., as a first gray counter 870 and a second gray counter 871 in FIG. 21A and by reference numeral 870 in FIGS. 20A-20B), which are blocks that manage resetting of the counters 900 and 903 in FIG. 21A (and also shown in more detail as counter 900 in FIG. 24) and additional circuitry, which defines its operation depending on the configuration bits, and also executes the cycling of counters between the readout and counting modes and enables the counters for readout.

The gray code counter 870 shown in FIGS. 20A-20B, increments with each incoming pulse (in1s or in2s) on the input. The advantage of the ripple counter over the synchronous configuration is that the in signal drives only one D flip/flop 872 in FIGS. 20A-20B, significantly reducing capacitive load of the trace. The architecture of the counter can be optimized by utilizing only canonical gates (NANDs and NORs) to implement the required logic for counting. The first D flip/flop is a divider by two of the in signal frequency, while the remaining D flip/flops 873, 874, 875, 876, 877, 878, 879 shown, for example, in FIGS. 20A-20B store the consecutive bits of the counter. The second, third, fifth and seventh bit of the counter use a positive edge triggered D flip/flop 874, 875, 877 and 879, while the first, fourth and sixth bit of the counter use a negative edge triggered D flip/flop 873, 876 and 878. The bits from the second to seventh are reset via common rst line. The D flip/flop of the divider by two and the first bit of the counter are D flip/flops 872 and 873 that can be set or reset. The D flip/flop 872 in FIGS. 20A-20B of the divider by two is reset dominant, while the D flip/flop 873 in FIGS. 20A-20B of the first bit of the counter is set dominant in order to work correctly with the counter management block. Each bit can be buffered by tri-state buffers 880 shown in FIGS. 20A-20B.

Figure 3:
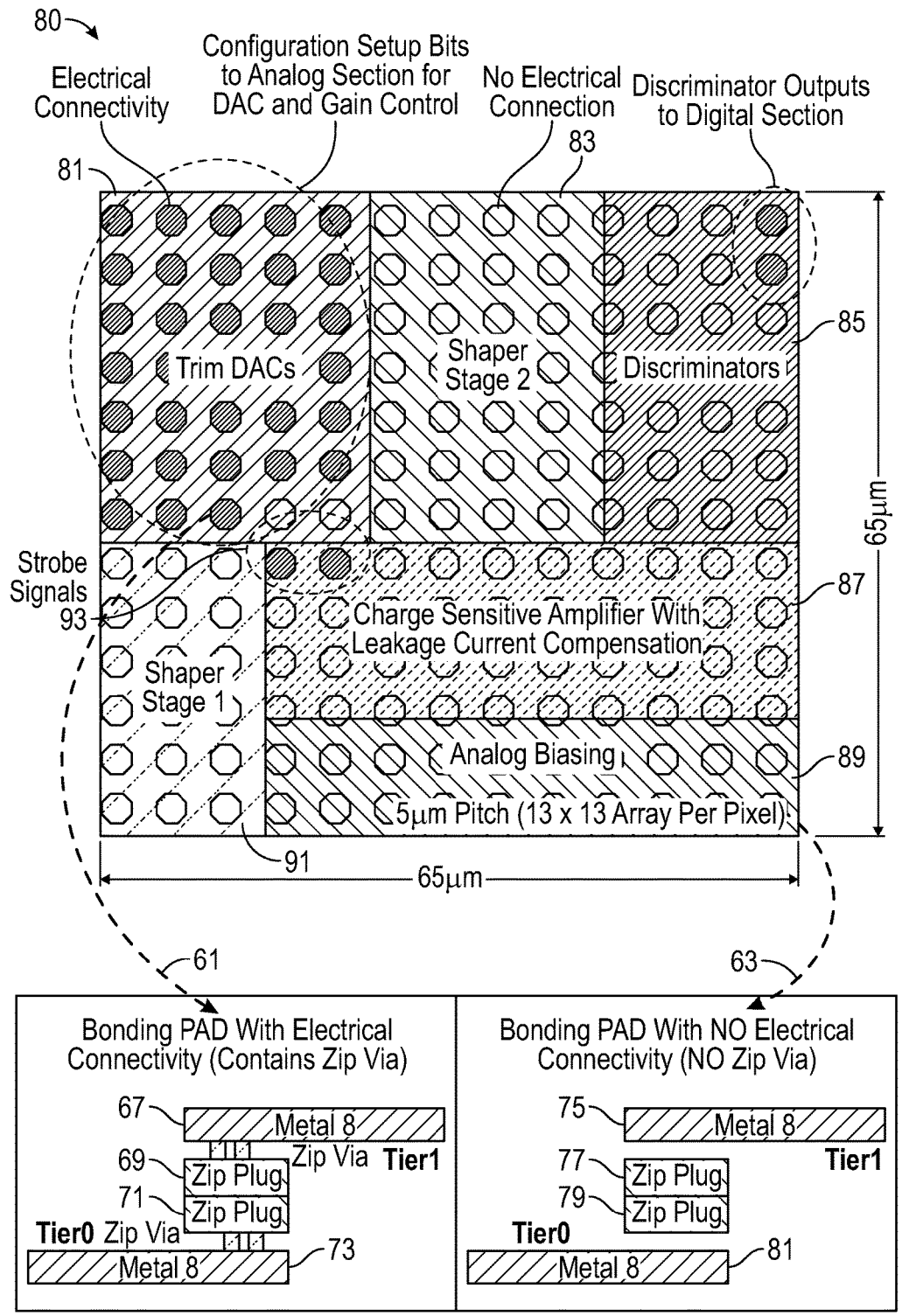
FIG. 3 illustrates a layout diagram of the inter-tier bonding interface for a chip design, in accordance with an example embodiment.

FIG. 3 illustrates an analog pixel bonding interface layout with locations of the various analog functional block layouts connecting to the analog pixel on one side and a part of the digital sub-chip on the other. Approximately 25% of the bonding interface contains electrical connections between the analog and digital tier; these connections have a zip via 72 and 74 between the zip plug 69 and 71 and a metal 8 trace 67 and 73 as discussed below. Other connections have no zip via between the zip plug 77 and 79 and a metal 8 trace 75 and 81. The rest of the connections provide mechanical bonding and do not contain zip via. The layout depicted in FIG. 3 includes six areas 81, 83, 85, 87, 89 and 91. Area 81 is an area dedicated to trimming digital-to-analog-converters offering configuration setup bits with respect to the analog section for digital-to-analog-converters for offset corrections and gain controls. This section is shown in FIG. 3 as offering electrical connectivity through dark solid hexagons. Sections not offering electrical connectivities are open hexagons. The dashed circle 41 shown in FIG. 3 refers to configuration setup bits to the analog section for DAC and gain control.

The section or area 83 is a "Shaper Stage 2" section and does not have any electrical connections (i.e., non-electrical connections). The area 85 of the layout shown in FIG. 3 is dedicated to discriminators and includes, for example, discriminator outputs to the digital tier as indicated by the dashed circle 43. Area 87, shown in FIG. 3, is dedicated to a charge sensitive amplifier with leakage current compensation. The area 89 is dedicated to analog biasing (e.g., 5 um pitch (13×13 array per pixel)), and the area 91 is dedicated to a "Shaper Stage 1" section. A small area 93 is dedicated to strobe signals and this area is a sub-section of area 87 (i.e., charge sensitive amplifier with leakage current compensation). Note that in the example depicted in FIG. 3, the layout is shown with dimensions of 65 um×65 um. It can be appreciated that these dimensions or parameters are examples only and should not be considered limiting features of the disclosed embodiments, similarly to the number of connections of the bonding interface carrying the electrical signals between the tiers.

The arrows 61 and 63 shown in FIG. 3 point respectively to a bonding PAD with electrical connectivity (contains Zip via) and a bonding PAD with NO electrical connectivity (NO Zip via). The electrical connectivity arrangement includes a metal layer 67 (Metal 8) disposed above a Zip Via 72, which in turn is disposed above a Zip Plug 69 that is located above a Zip Plug 71. A Zip Via 74 is located between the Zip Plug 71 and another metal layer 73 (Metal 8). Thus, a Tier 0 and a Tier 1 are shown with respect to the electrical connectivity arrangement shown in FIG. 3.

A non-electrical connectivity arrangement is shown in FIG. 3 to the right of the electrical connectivity configuration. This bonding PAD with NO electrical connectivity (NO Zip via) includes a metal layer 75 (Metal 8) above a Zip Plug 77 and a Zip Plug 79. A metal layer 45 (Metal 8) is also depicted in the non-electrical connectivity arrangement shown at the bottom left in FIG. 3.

Figure 4:
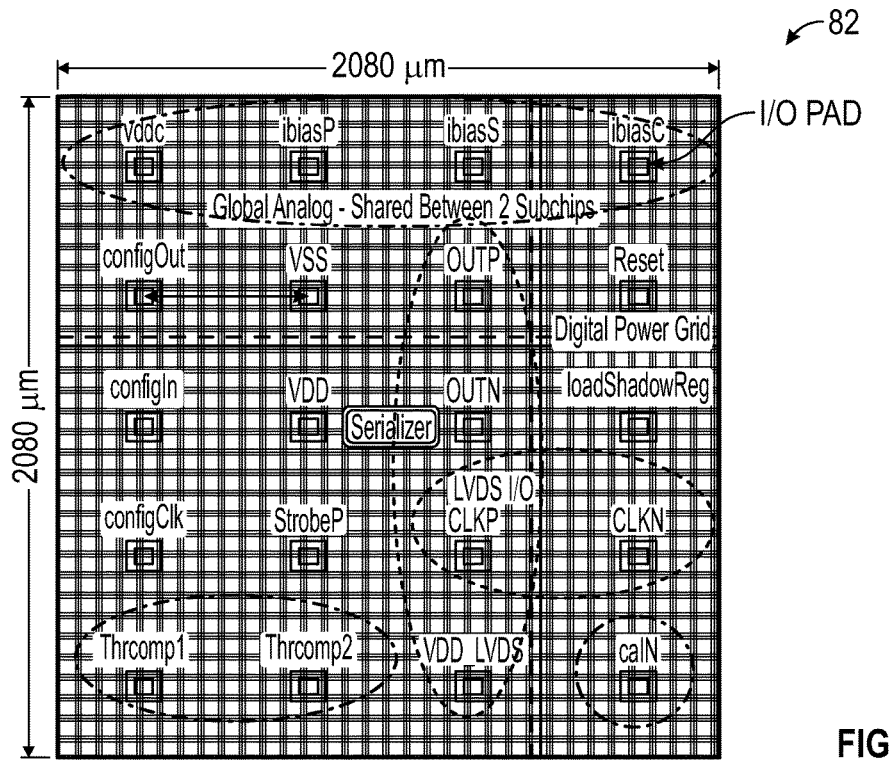
FIGS. 4 and 5 illustrate sub-chip layouts having the sub-chip digital functionality shown in FIG. 2, in accordance with an example embodiment.
Figure 5:
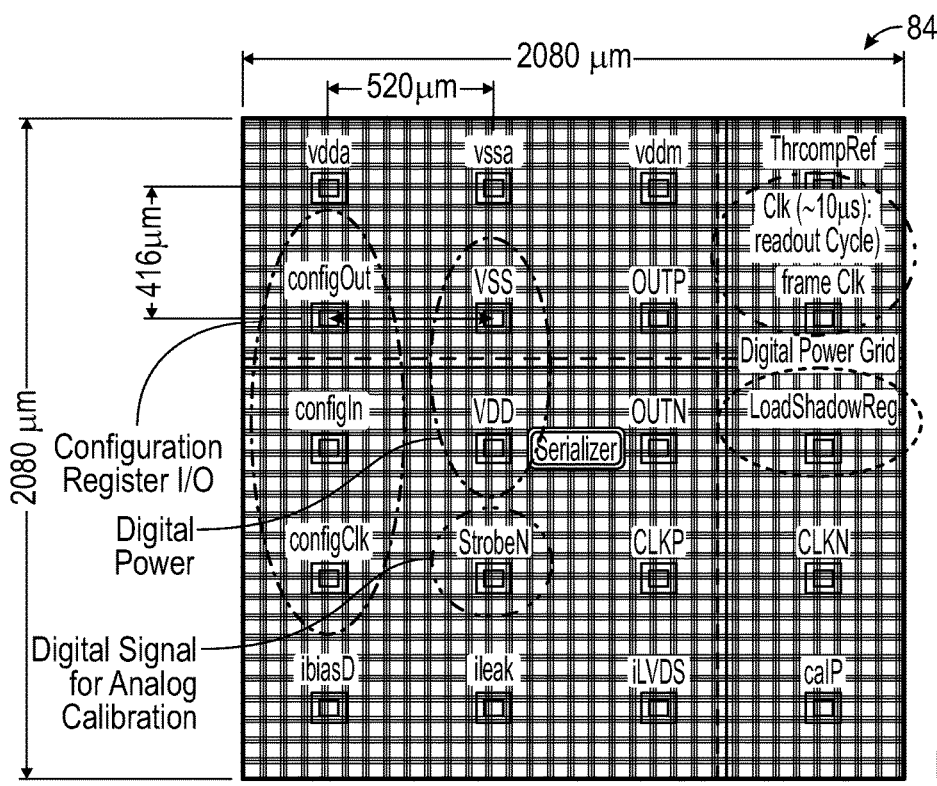

FIGS. 4 and 5 illustrate sub-chip layouts 82 and 84 having the sub-chip digital functionality shown in FIG. 2, in accordance with an example embodiment. Each sub-chip can contain, for example, 20 bump-bond pads for external I/O's, which can be created using back metal connected to Metal 1 in the ASIC via multiple TSVs (through-silicon vias) (preferably multiple TSVs, e.g. more than 100, per group). These bump-bond pads can, for example, be 60 μm×60 μm in size, and can be placed with a horizontal and vertical pitch of, for example, 520 μm and 416 μm respectively. Routing of higher density bump-bond pads on the readout board would require very aggressive sizes and separation of traces. A total of, for example, 720 bump-bond pads can be utilized per ASIC.

To minimize complexity, global signals can be shared between two sub-chips and the full chip is built with stitched sub-chips together. The 14 analog power and bias signals can be distributed on the top and bottom of the sub-chip, these need to be connected from Metal 1 to 8 on the digital tier, which is then electrically connected to Metal 8 of the analog tier. Shared signals can also include digital signals used for analog calibration, StrobeN and StrobeP signals for test charge injections to the charge sensitive amplifier, digital reset and frameClk. Configuration register clock and I/Os and serializer differential I/O (e.g., see the output serializer 68 shown in FIG. 2) can be dedicated signals for a sub-chip.

The bump-bond pad sizes are approximately the same size as a pixel. The analog bump-bond pads, irrespective of their placement within a sub-chip, will partially overlap with inter-pixel electrical connectivity at fixed locations, every, for example, 65 micrometers. Hence, these need to be custom designed to make sure that the inter-pixel connections are not shorted to global signals. These bump-bond pads also create routing and placement restrictions in certain areas across the digital sub-chip. A power and ground grid for digital power supply VDD and ground VSS can be created utilizing top two metal layers (e.g., vertical Metal 8 and horizontal Metal 7), approximately 10 μm wide at 65 μm pitch.

The differential line transmitters and receivers can be placed close to the I/O pads and occupy, for example, approximately 100 μm×300 μm area. The central area of the sub-chip is blocked and used to place the high-speed output serializer such as the output serializer 68 shown in FIG. 2.

Edgeless implementation of the digital tier is challenging from an CAD-EDA tool perspective, due to the complexity of functional features required for the application, as well as the placement constraints listed earlier. A digital sub-chip implementation may in some cases require the use of CAD-EDA tools in a specialized approach, due to the various placement and functional constraints. The development stages can be sub-divided depending on the customization required as follows.

For full custom digital layout, the hit processor 820 in FIG. 17, accepts the outputs from the discriminators from the analog tier passed through the window discriminator logic 890 in FIG. 23 and increments, for example, a 7-bit gray-counter to register the number of photon hits in the pixel in a given time frame given by the time between two rising edges of the frameClk signal. Since the pixel has two 7-bit counters for dead-time less operation, at any given time, one counter is in 'count mode' and the other is in 'read mode' if it had valid data in the previous frame or is 'idle' according to the timing diagram 881 in FIGS. 21A-21B. At the rising edge of the frameClk signal, the counters which were in 'read mode' but not yet read out will be reset, while those in 'count mode' with valid data will be swapped and placed in 'read mode'.

Counters, which were not used, can remain in the 'count mode.' This feature conserves power in low occupancy detector applications. The logic that checks if the counter is occupied and asynchronously resets it after readout is sensitive to glitches. Hence, a gray-code counter is preferred to a binary ripple counter to reduce the number of switching bits. Additionally, the choice of a gray-code counter reduces power consumption. Several user-defined functions can also be added such as utilizing only a single comparator instead of a window discriminator 890 in FIG. 23, based on levels of w_en and w_enb signals, derived from the ddl_en signal shown in FIG. 23, etc. The design is asynchronous, without the requirement of a high-speed clock tree distribution, as the data is generated by photon arrival. The design is sensitive to parasitics, and a full custom layout, as disclosed herein, is required. 1024 hit processors 820 in FIG. 17 full custom layout blocks can be located across the sub-chip, close to the comparator outputs from the analog tier, but not regularly.

Figure 25:
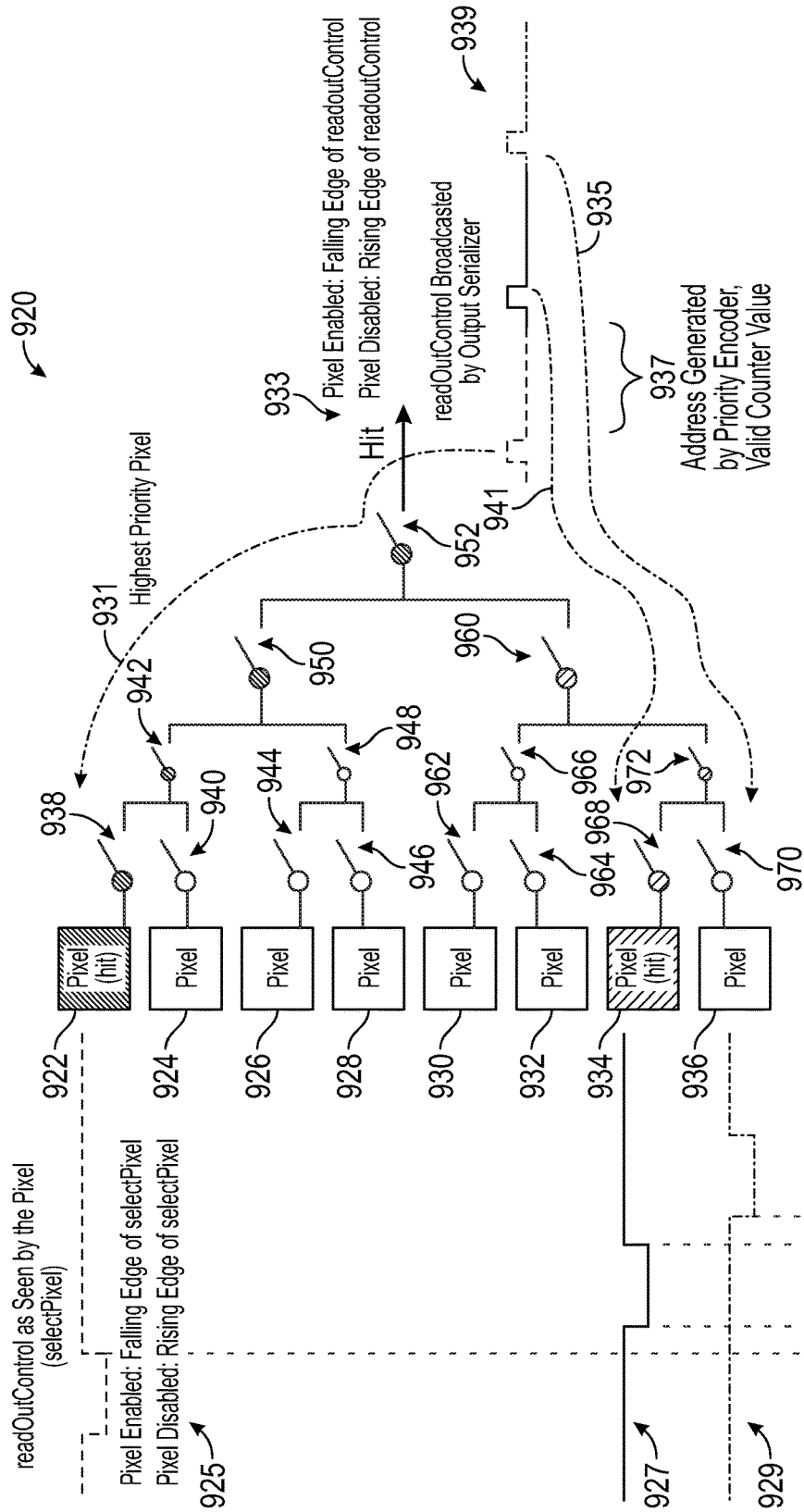
FIG. 25 illustrates a schematic diagram depicting the electrical layout of a priority encoder circuit with a path for propagating pixel selection waveform, in accordance with an example embodiment.

The layout of the priority encoder circuit 920 as shown in FIG. 25 (e.g., see the priority encoder (top) 70 and priority encoder (bottom) 76 in FIG. 2) uses semi-custom digital placement. The priority encoder can be utilized for zero-suppression readout of data. This increases the data throughput by only reading those pixels, which received photon hits during the time frame (exposure window) defined by the frameClk. The basic data is a simple combination of counter value and pixel address. The priority encoder is a binary tree capable of automatic generation of addresses of the pixels. In one direction the priority encoder is a giant OR gate, whose output is activated if at least one pixel has data for readout. In the opposite direction, the priority encoder carries the confirmation signal enabling pixels for readout according to the priority order. The returning signal, thanks to some combinatorial logic, generates binary address of the pixel that is selected for readout. The priority encoder can be divided into two parts each generating a 9-bit address for 512 pixels 70 and 76 in FIG. 2. This allows access of the two parts in an interleaved manner, providing enough time for the address bus to settle in each part when a pixel is selected. The priority encoder heavily relies upon symmetry; its placement doesn't need to be as confined as the hit processor 820 in FIG. 17 but needs to be guided and symmetrically aware. A symmetrical mirror clone-placement methodology can be utilized to place and route in the CAD-EDA tool.

Figure 6A:
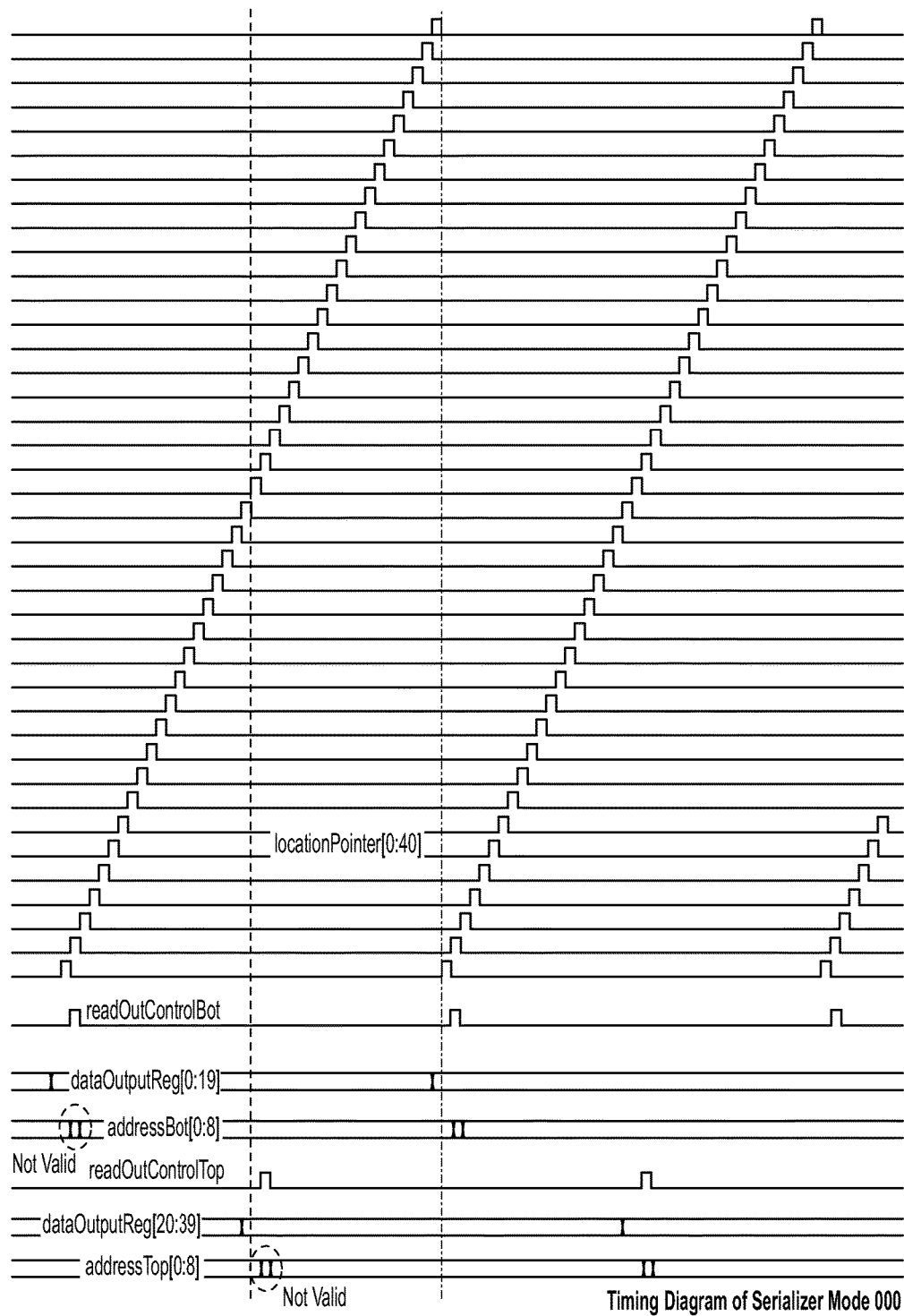
FIG. 6A illustrates a timing diagram of the basic serializer mode, in accordance with an example embodiment.
Figure 6B:
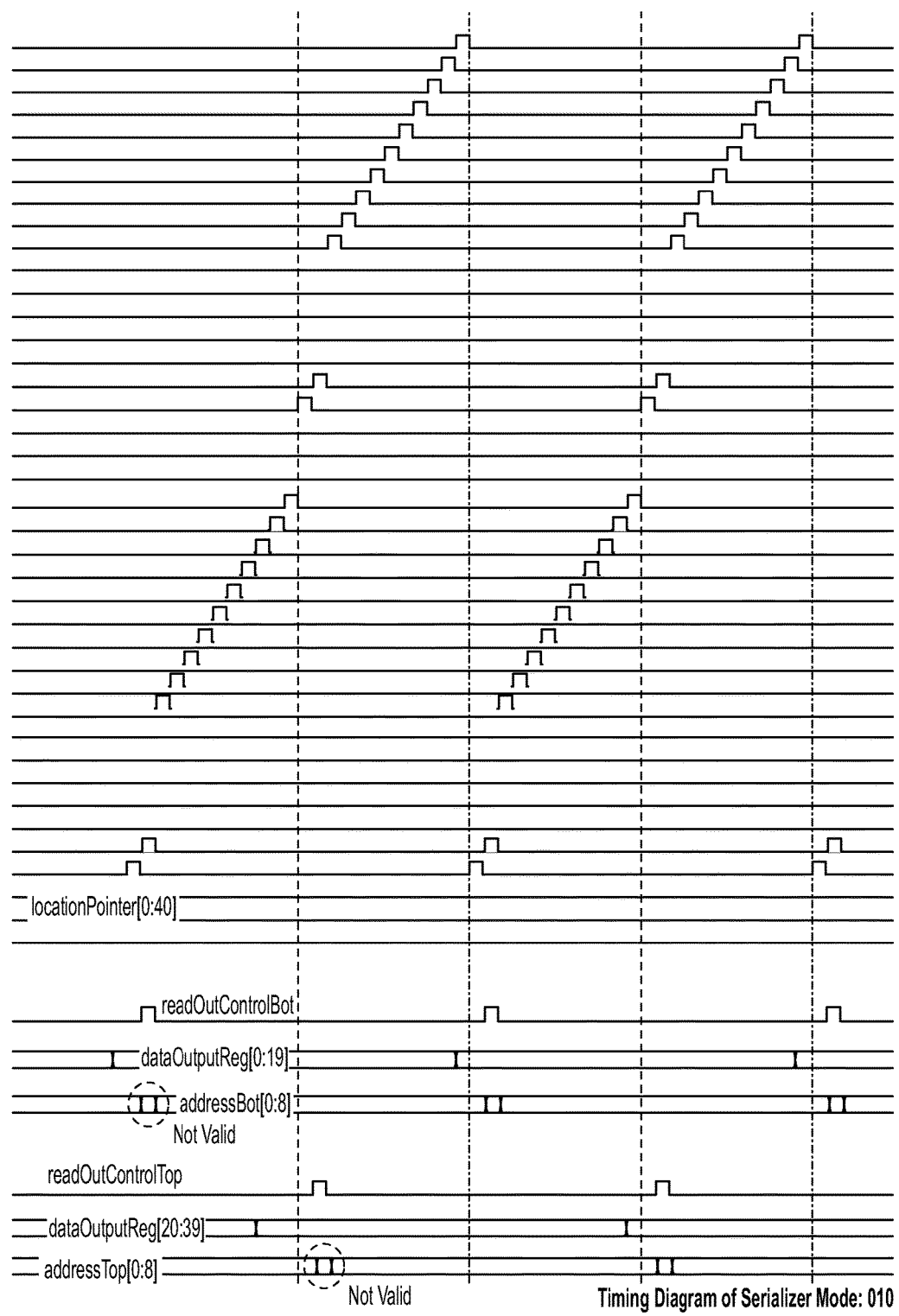
FIG. 6B illustrates a timing diagram of a serializer mode with skipped some data bits, in accordance with another example embodiment.

FIG. 6A illustrates a timing diagram of a serializer mode, in accordance with an example embodiment. FIG. 6B illustrates a timing diagram of a serializer mode, in accordance with another example embodiment. This modes are programmed through the configuration register and allow outputting lower number of bits, for example skipping pixel addresses in the imaging mode, skipping some counter bits in imaging or sparsifier mode or skipping some synchronization marker bits that are added in the serializer.

Figure 7:
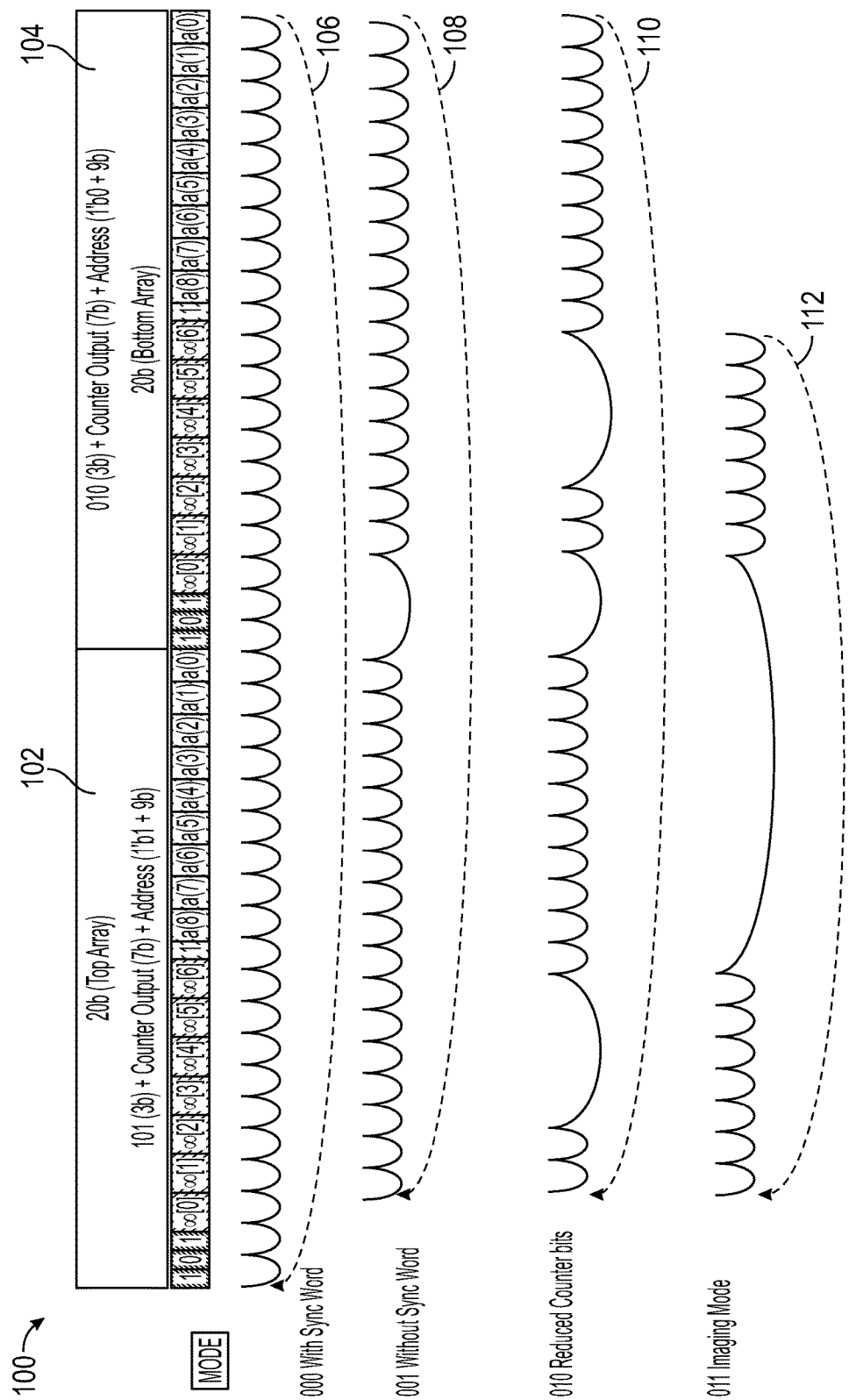
FIG. 7 illustrates a conceptual diagram depicting output serializer readout for different modes of operation with skipped selected bit of data, in accordance with an example embodiment.

FIG. 7 illustrates a schematic diagram depicting output serializer 68 in FIG. 2 readout for different modes of operation, in accordance with an example embodiment. The example different modes of operation depicted in FIG. 6 are modes 106, 108, 110, 112. Mode 106 involves "000 with synchronization word." Mode 108 involves "001 without synchronization word." Mode 110 involves "010 reduced counter bits" and mode 112 is an "011 imaging mode no pixel addresses". The various modes 106, 108, 110 and 112 are shown in FIG. 6 with respect to a top array 102 and a bottom array 104. This is not exhaustive list of possible modes, however implantation of other modes is straightforward.

Change of modes as illustrated in FIGS. 6A, 6B and 7 can be achieved at least partially through the use of the configuration register 62 and the output serializer 68 with mode selection.

The configuration register 62 contains a long shift register chain (e.g., 21,510-bit long). It is the serial communication for programming of the ASIC. Each pixel can contain 21-bits out of which 19-bits need to be sent to the analog pixel across the bonding interface. An additional 6-bits can be used for global programming of the ASIC, such as readout mode selection, etc. Once the shift register is programmed, its contents can be copied to a shadow register. This block requires clock tree distribution done in CAD-EDA of both the configClk for serial shifting and loadShadowReg for parallel loading of the shadow register.

The output serializer 62 can be used for high speed data transfer to the FPGA array (e.g., FPGA devices 14, 16, 18, 20 shown in FIG. 1) for further data processing and sending the data to storage. The output serializer 62 can use a high-speed (about 400 MHz) serializerClk to transfer data off chip. This block can be centrally placed in a sub-chip. It utilizes the data driven capabilities of the CAD-EDA tool for accurate timing and data integrity. For convenience and speed, this part of the sub-chip can be routed as a separate block in CAD-EDA tools.

The three stages of the digital design flow can be iteratively repeated, and parasitic annotated in the CAD-EDA tools. Standard delay format (.sdf) files can be created, wherein the top level is simulated across design corners to verify functional performance in the CAD-EDA tools. The result of this procedure ensures a parasitically aware optimum floor-plan. This also maintains timing integrity for timing critical circuits without overloading the CAD-EDA tools.

Regarding managing data transfer, photons, arriving asynchronously at the detector, generates charge in the sensor, which can be processed by the analog pixel and subsequently events can be counted in the digital hit processors within a certain time period. This time period can be determined externally by the user and defined within the ASIC as one period of the frameClk. The resolution of measurement of photon time of arrival is determined by frameClk, which can typically range from a few hundred nanoseconds to a few tens of microseconds or more depending on the application. Typically it is set at <10 μs. The change of frame caused by the rising edge of the frameClk always creates a new priority list for pixel readout established by the priority encoder.

For certain applications, the frameClk rates may need to be faster e.g. about 200 ns or less. However only 4 valid full data packets at a data transfer rate of 50 ns/data packet can be read within this time frame. A really short exposure time, for example, can result in very few events. Hence, a 7-bit counter will certainly not be fully occupied. Thus, truncating the counter to, for example, 2-bits, will be sufficient. Hence, various readout modes can be developed to change the length of the data packet, which reduces the time for data transfer/packet.

The high-speed output serializerClk, is independent of the slower frameClk, which are not necessarily aligned with each other. Although synchronizing the two clocks is possible, the application might require independent setup of frameClk and serializerClk. Furthermore, synchronization still does not guarantee correct alignment of the two signals when they reach a pixel, as the clock tree for the frameClk is different from the path readoutControl (derived from the serializerClk) utilized through the priority encoder. The delays of these signals are position dependent and cannot be well controlled for a high-speed system. The power penalty from buffering and managing the clock tree of a slow clock with a high-speed clock is unnecessary, and practically unfeasible. However, it is necessary to make sure that data integrity is maintained during frame changes.

The full output data packet can include, for example, a 3-bit synchronization header, a 7-bit counter value and a 10 bit pixel address. This data can be serially transferred using high-speed differential outputs and an output serializerClk running at, for example, about 400 MHz.

Regarding readout modes, the data output of the ASIC can be either operated in a zero-suppressed or full-frame imaging format, which results in different data packet lengths that are necessary to send. In the zero-suppressed format, the data packet needs to contain the 10-bit pixel address and between 2-7 bits of counter value, furthermore the 3-bit synchronization header is optional (but may be essential for debugging). In this case, for example a 20-bit data packet transfers a 3-bit start symbol, a 10-bit pixel address and a 7-bit counter value, requiring 50 ns to transfer a single data packet, or a 10-bit pixel address and 2-bit counter value, requires 30 ns. In the full imaging format, since every pixel is read out, only the 7-bit counter value is required, with 17.5 ns for readout per data packet, which achieves a 55 kfps for a 1 Mpixel detector. This may increase considerably if fewer counter bits are chosen.

Since, the time it takes for the shortest data to be read out requires, for example, <17.5 ns, building a one stage pipeline ensures sufficient time for the next valid data to be transferred from a pixel to the serializer 68 ready for serial readout. Hence, the 1024 pixels in a sub-chip have been divided into two banks of 512 pixels (top and bottom), each with its own 9-bit priority encoder. This allows for a reconfigurable output serializer 68 with a maximum 40-bit long register, where the two banks have their own independent 20-bit output registers. Interleaved latching of data from the two 512 pixel banks into two parts of the serializer 68, operates as a one-stage pipeline. When one bank is being readout the other bank is being latched. FIG. 7 thus shows the main readout modes 106, 108, 110 and 112 discussed previously.

Maintaining data integrity at frame changes presents a challenge. During the current time frame, each pixel with valid data, sends a request signal for read out (rd_rq), to the priority encoder. The priority encoder (e.g., priority encoder (top) 70 and priority encode (bottom) 76) establishes the order in which the pixels are allowed to transfer data to the output serializer 68. The output serializer 68 allows a specific time window for the counter output to be transferred and the address to become available, such that it can be latched in time for off-chip data transfer (by the loadSerializer).

The rising edge of the frameClk, changes the frame. Counters in the 'readout mode' are reset, those in the 'count mode' are changed to 'readout mode' and those that are 'idle' do not change. Simultaneously, the priority encoder creates a new priority list by assigning the order in which multiple pixels are read out. The following signals are involved in data readout: frameClk, readoutControl, selectPixel (n), and load serializer.

A rising edge of the signal frameClk is used to indicate change of frame. The signal readoutControl 934 in FIG. 25 can be used to enable data transfer from a pixel to the serializer register, which is generated by the output serializer. This signal is interleaved between the two 512 pixel banks and is alternately broadcasted to the top pixel matrix and then to the bottom pixel matrix for pixel selection. The readoutControl pulse width is 2.5 ns corresponding to the serializerClk of 400 MHz. The time between the pulses of readoutControl is set by the readout mode depending on the number of output bits.

The selectPixel (n) 925, 927, and 929 in FIG. 25 signal allows for the contents of the counter to be enabled and the pixel address to be established by the priority encoder. Effectively, this signal is the readoutControl (rd_enb) signal as seen by the pixel, controlled by the priority encoder. The negative edge of the readoutControl enables the pixel and the positive edge disables it. The next negative edge of readoutControl selects a new pixel, next in the priority list established by the priority encoder. The loadSerializer signal can be utilized to latch data alternately from the top and bottom pixel matrix. It is issued just before the next pixel is selected to ensure that the data has sufficient time to settle before being latched.

It is important to note that if the rising edge of frameClk occurs when the readoutControl is high, the current pixel has been disabled but a new pixel has not yet been selected. Hence, no data is corrupted, and the priority encoder can create a new priority list before the next pixel is enabled.

Figure 8:
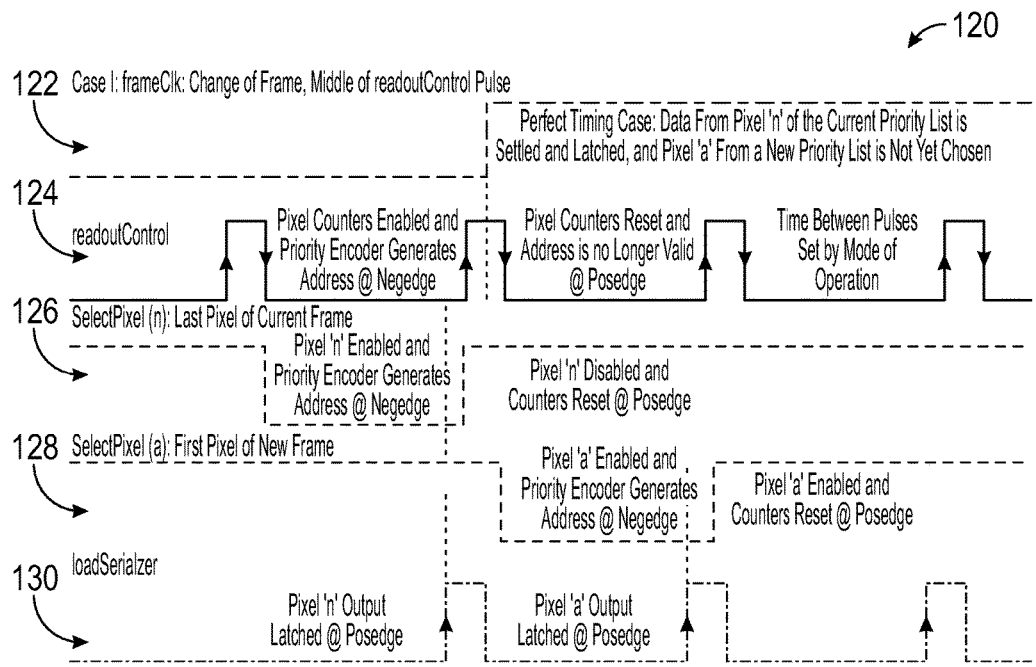
FIG. 8 illustrates a group of timing diagrams indicative of a best case scenario (Case I) in which no data transfer to the serializer is corrupted due to change of time frames, in accordance with an example embodiment.
Figure 9:
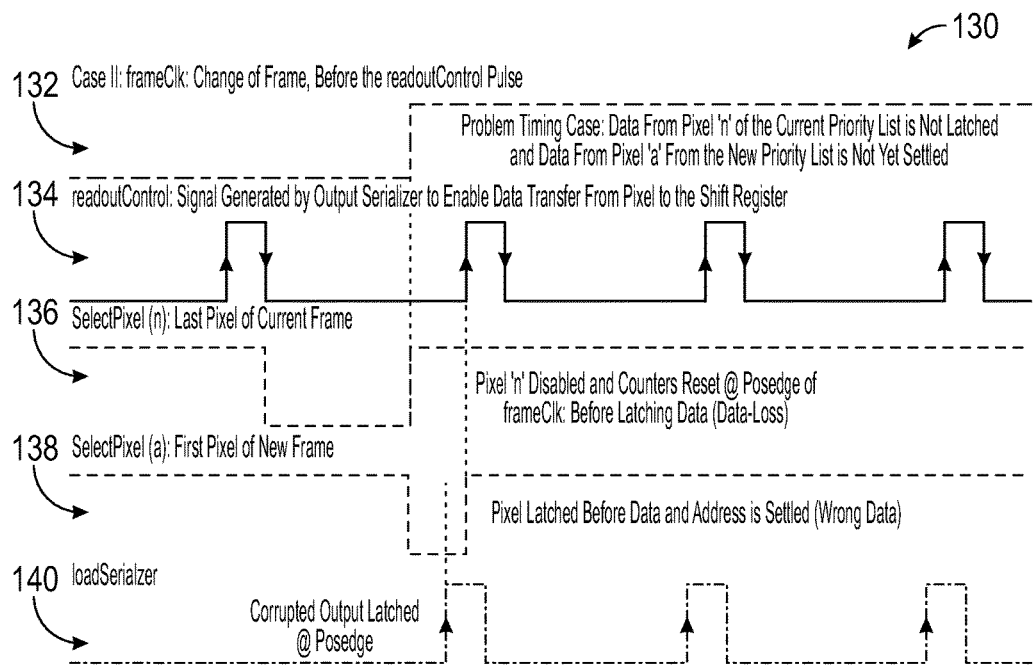
FIG. 9 illustrates a group of timing diagrams indicative of activities (Case I) involving a change of frame requested before a readoutControl pulse in accordance with an example embodiment.

The timing diagrams of three case scenarios are depicted in FIGS. 8, 9, 10, 11, 12, 13 and 14. FIG. 8 illustrates a group 120 of timing diagrams 122, 124, 126, 128, 130 indicative of a best case scenario (Case I) in which no data is corrupted, in accordance with an example embodiment. FIG. 9 illustrates a group 130 of timing diagrams 132, 134, 136, 138, and 140 indicative of activities (Case II) involving a change of frame before a readoutControl pulse, in accordance with an example embodiment.

Figure 10:
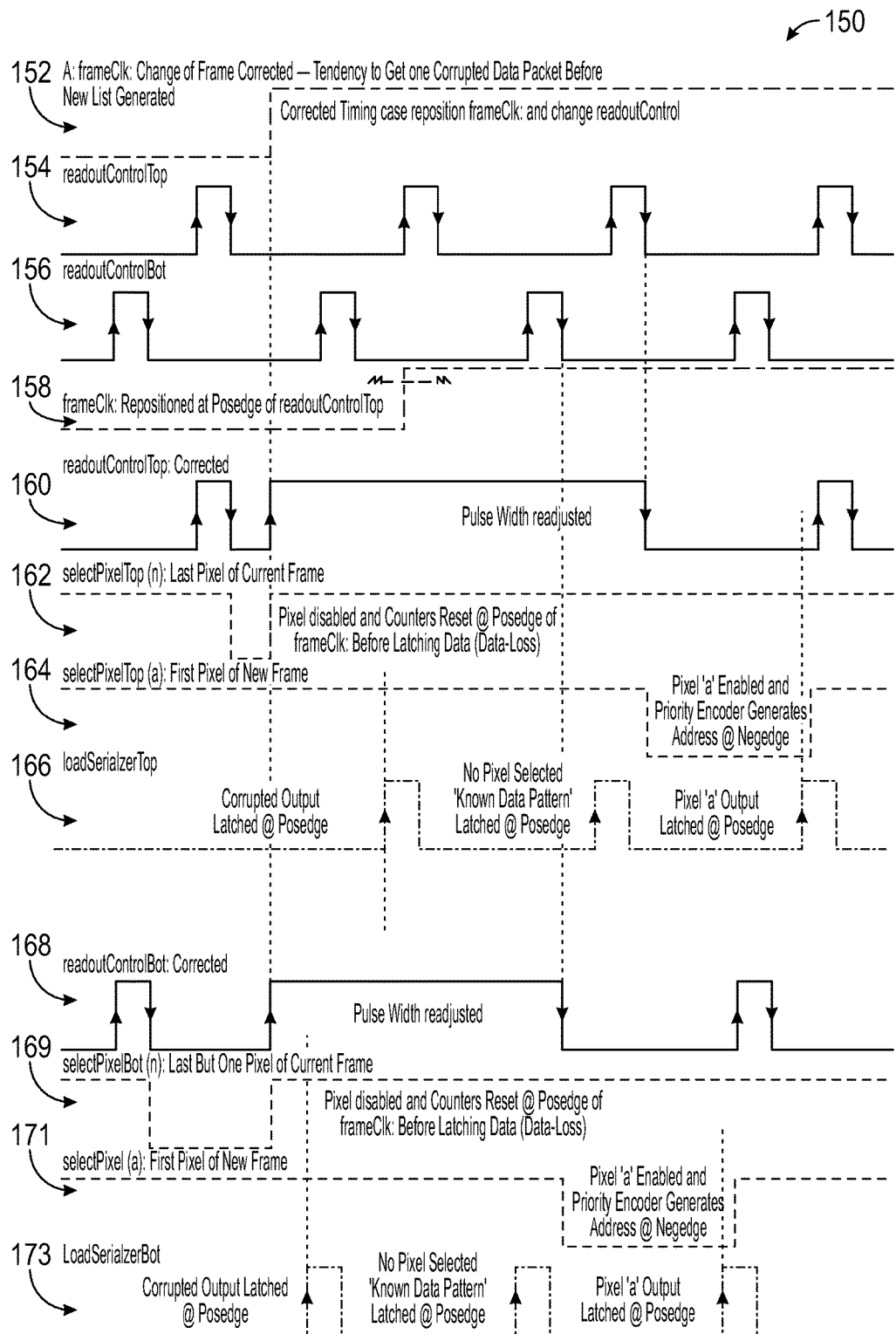
FIG. 10 illustrates a group of timing diagrams with change of time frame corrected indicative, in accordance with another example embodiment.
Figure 11:
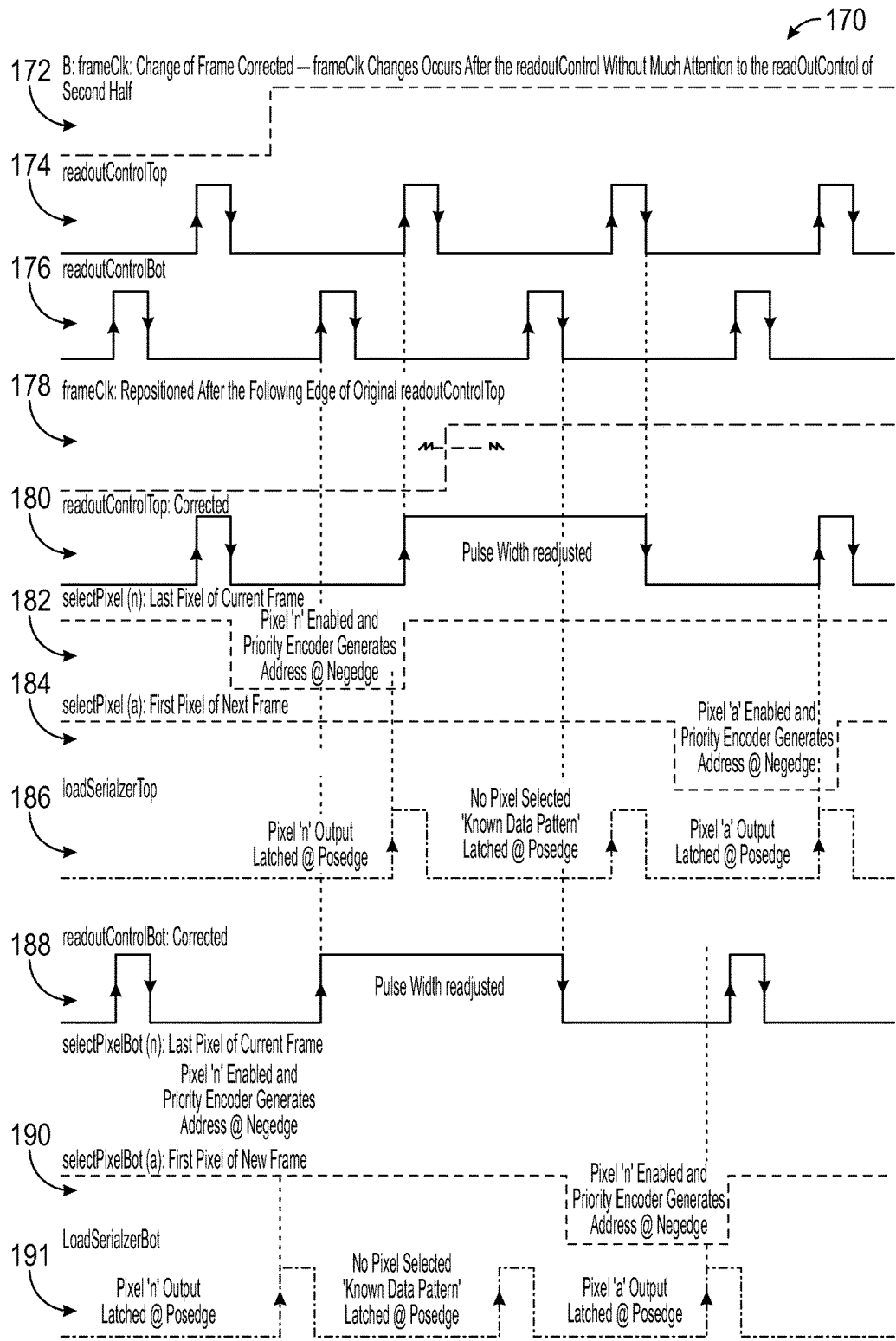
FIG. 11 illustrates a group of timing diagrams with change of time frame corrected, in accordance with another example embodiment.
Figure 12:
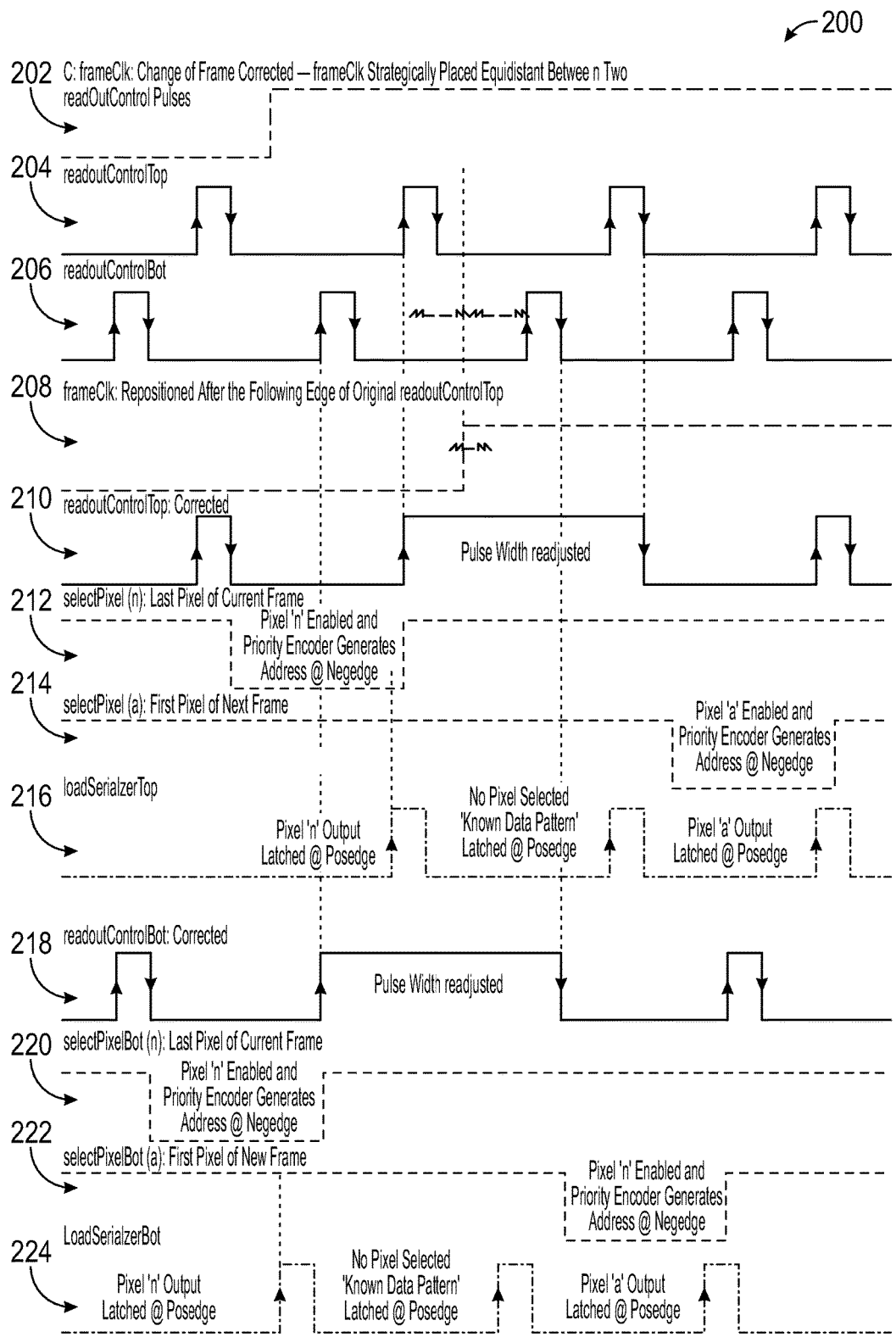
FIG. 12 illustrates a group of timing diagrams with change of time frame corrected equidistantly, in accordance with another example embodiment.
Figure 13:
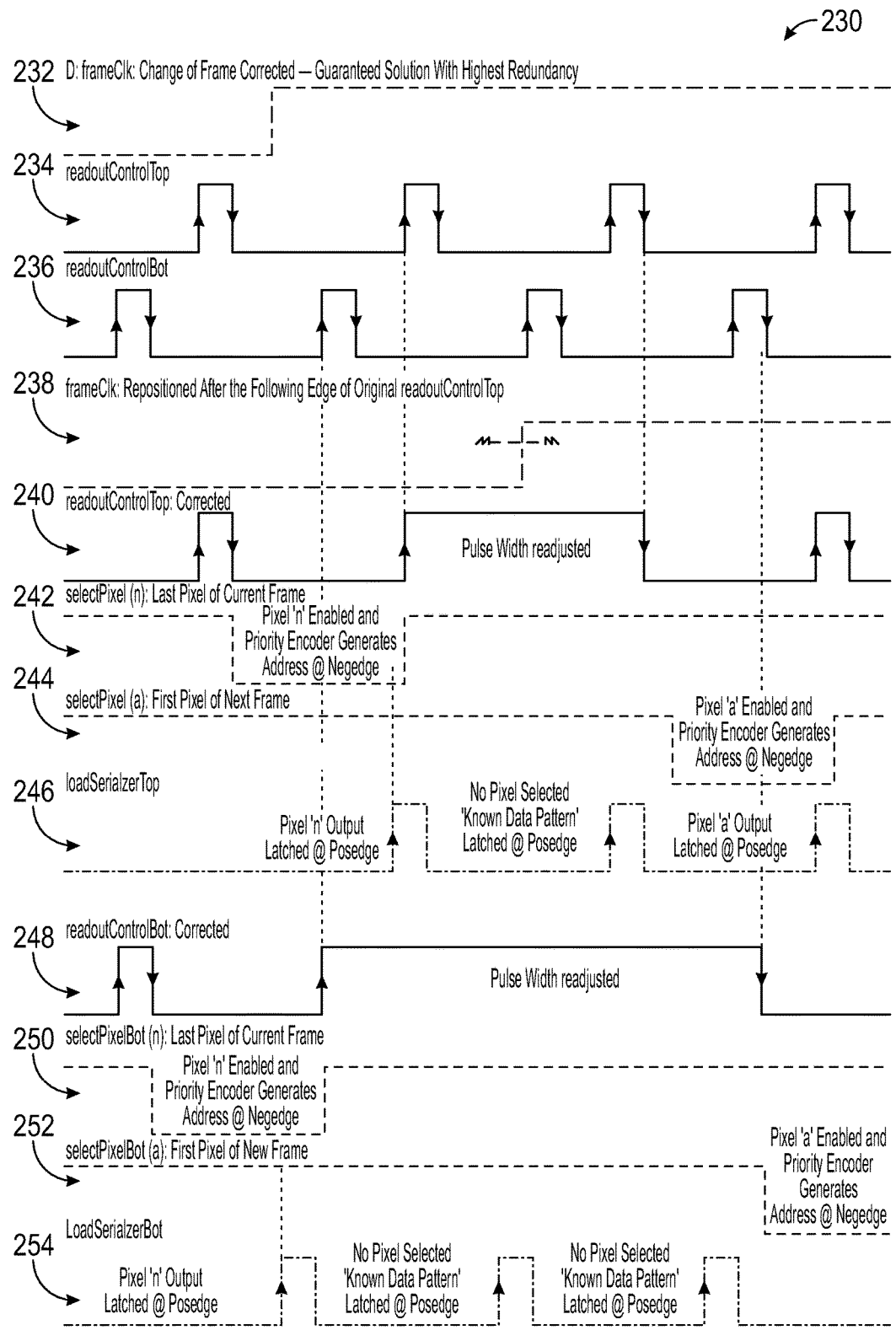
FIG. 13 illustrates a group of timing diagrams with change of time frame corrected equidistantly and with highest timing margin, in accordance with another example embodiment.

FIGS. 10, 11, 12, 13 respectively illustrate timing diagram groups 150, 170, 200, and 230. FIG. 10, for example, depicts a group 150 of timing diagrams 152, 154, 156, 158, 160, 162, 164, 166, 168, 169, 171, and 173 indicative of corrected behavior for a change of frame (e.g., Case III), in accordance with an example embodiment. For simplicity, in Case I and II shown respectively in FIGS. 8-9, the signals corresponding to only one half of the pixel matrix are shown. The group 170 of timing diagrams depicted in FIG. 11 includes timing diagrams 172, 174, 176, 178, 180, 182, 184, 188, 190, and 191. The group 200 shown in FIG. 12 includes timing diagrams 202, 204, 208, 208, 210, 214, 216, 218, 220, 222, and 224. The group 230 depicted in FIG. 13 includes timing diagrams 232, 234, 236, 238, 240, 242, 244, 246, 248, 250, 252, and 254.

Although case I is the ideal scenario for one half of the priority encoder, for the second half, the same frame change does not allow for sufficient time for the address to settle. The timing diagram for the second half is similar to Case II. Case I, also assumes that the frameClk reaches the selected pixel exactly when readoutControl is high. Frame changes can occur at the edge of the readoutControl signal due to different delays of the signals, which can vary from pixel-to-pixel. This can result in glitches in the digital circuit leading to data corruption or losses.

In case lithe change of frameClk can be shifted even further from the edge of readoutControl. This results in disabling the current pixel and hence data it is lost. It simultaneously moves the priority encoder pointer to the first pixel of the new priority list. However, if there is not enough time for data to settle, corrupted data will be latched by the output serializer. The highest priority data of the new frame is then lost.

The case III scenarios shown in FIGS. 10, 11, 12, 13 indicate the change of frame after modification. The correction in FIG. 10, for example, is based on realizing that the last data in the old priority list is not as important as the first data in the new priority list. It is acceptable to lose the last data but loss of first data in a frame should be avoided.

The rising edge of the frameClk, triggers the rising edge of readoutControl for both the top and bottom halves. This disables the last pixel being readout before the frame changes. The readoutControl is then held high up until at least one complete readout cycle is finished. The frameClk, distributed to the pixels is then delayed to the middle of the high state created on the readoutControl. This ensures the arrival of frameClk edge to any pixel in the matrix when readoutControl is high. Adjusting these signals in this manner leads to a minimal unavoidable dead-time in the readout of data. The following sequence with a time frame change is achieved on the output serial link: two unavoidably corrupted last data outputs, two known data patterns corresponding to frame change and then restarting readout with data from the top of the priority list in the new frame.

Example embodiments can be implemented in the context of a VIPIC (Vertically Integrated Photon Imaging Chip) large area multi-tier ASIC having with complex analog signal processing and digital data processing capabilities, which is a key part of a large area edgeless detector system with minimum gaps between ROIC's (Read Out Integrated Circuits). Grouping a smaller array of pixels into a digital sub-chip allows for an adequate area, while maintaining indivisible functional features within a repeatable unit.

As discussed herein, in some examples, several readout modes can be implemented to allow the user to redefine a data packet and change the output data rate. It can therefore be appreciated that a novel technique and apparatus can thus be implemented, as disclosed herein, which can ensure that high priority data is not corrupted during frame changes.

FIG. 14 illustrates a table 231 comparing the four solutions discussed herein, in accordance with an example embodiment. The table 231 shown in FIG. 14 compares los of data, inefficiency (insertion of extra data packets), and any ambiguity of frameClk and readoutControl at a pixel with respect to four scenarios: correction with data loss, correction with frameClk repositioned after readoutControl, correction with frameClk positioned in the center of alternating readoutControl signals, and correction with highest data redundancy.

FIG. 15 illustrates a layout 780 of a VIPIC in a 6×6 sub-chip arrangement, in accordance with an example embodiment. An example sub-chip 782 as illustrated in FIG. 15 can include, for example, components such as the serializer 68, the LVDS driver 72, the LVDS receiver 74, and additional components 784 such as digital logic (e.g., priority encoder, configuration register, etc), an analog-digital pixel bonding interface (e.g., a mirror or corresponding image of the analog pixel), and customer digital blocks placed asymmetrically across the sub-chip.

Figure 16:
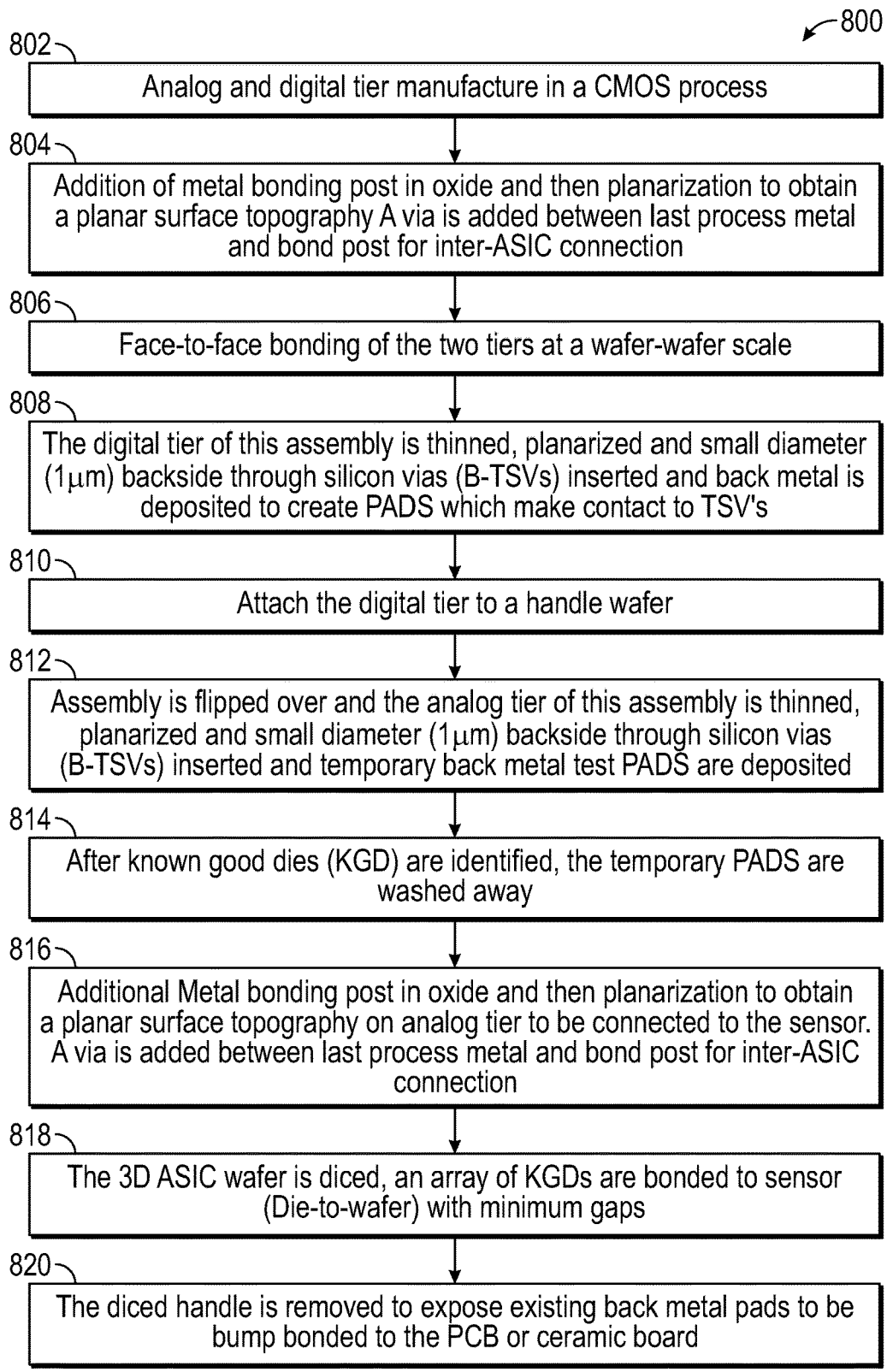
FIG. 16 illustrates a flow chart of operations depicting logical operational steps of a method for configuring an edgeless large area ASIC in accordance with an example embodiment.

FIG. 16 illustrates a flow chart of operations depicting logical operational steps of a method 800 for configuring an edgeless large area ASIC in accordance with an example embodiment. As shown at block 802, the process can be initiated for analog and digital tier manufacture in a CMOS process. Then, as indicated at block 804, an operation can be implemented involving the addition of a metal bonding post in oxide and then planarization to obtain a planar surface topography with a via added between the last process metal and the bond post for inter-ASIC connection. Following processing of the operation depicted at block 804, an operation involving face-to-face bonding of the two tiers at a wafer-wafer scale can be implemented, as indicated at block 806.

Then, the digital tier of this assembly can be thinned, planarized and a small (e.g., 1 um) backside through silicon vias (B-TSVs) can be inserted and a back metal deposited to create PADS which make contact to TSV's as shown at block 808. Thereafter, as shown at block 810 the digital tier can be attached to a handle wafer. Next, as indicated at block 812, the assembly can be flipped over and the analog tier of this assembly thinned and planarize with the insertion of a small diameter (e.g., 1 um) backside through silicon vias (B-TSVs) and the deposition of temporary back metal test PADS.

After KGD's (Known Good Dies) are identified, the temporary PADS can be washed away, as illustrated at block 814. Then, as described at block 816, an extra metal bonding post in oxide can be added and a planarization operation implemented to allow a planar surface topography on the analog tier to be connected to the sensor. As also shown at block 816, a via can be added between the last process metal and the bond post for inter-ASIC connection.

The 3D wafer can be then diced and an array of KGD's bonded to the sensor (die-to-wafer) with minimum gaps, as illustrated at block 818. The step or operation shown at block 818 can be implemented to dice the wafer and implement a die-to-wafer fusion bond array of KDG (known good die) to sensor wafer. The diced handle can be then removed to expose existing back metal pads be bump bonded to the PCB or ceramic board (e.g., see the substrate 24 shown in FIG. 1), as indicated at block 819.

Figure 26A:
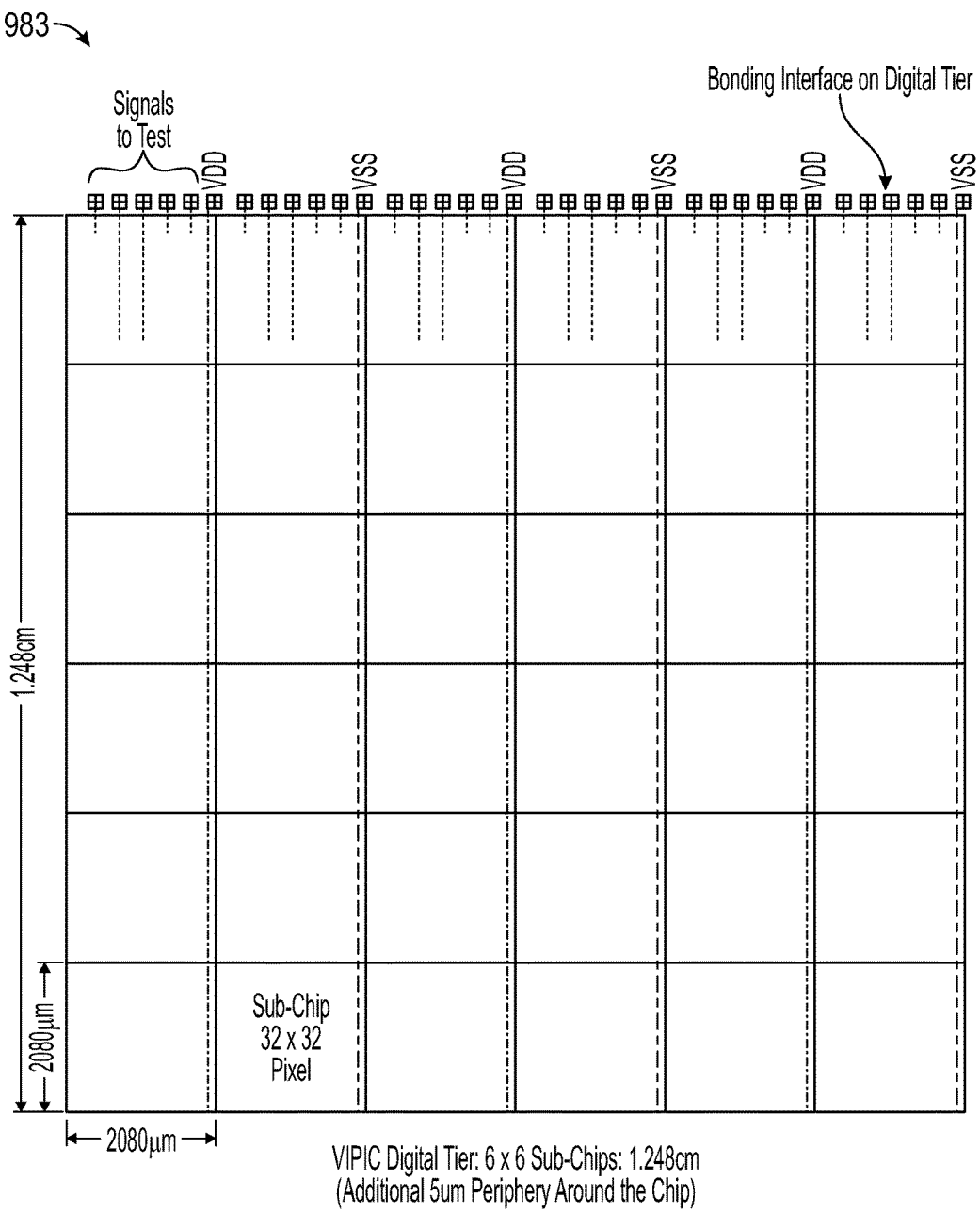
FIGS. 26A to 26B illustrate illustrates layout diagrams of a VIPIC digital tier and a VIPIC analog tier having "washable" analog and digital test PADS with bonding interface connections in the analog tier and in the digital tier, in accordance with an example embodiment.
Figure 26B:
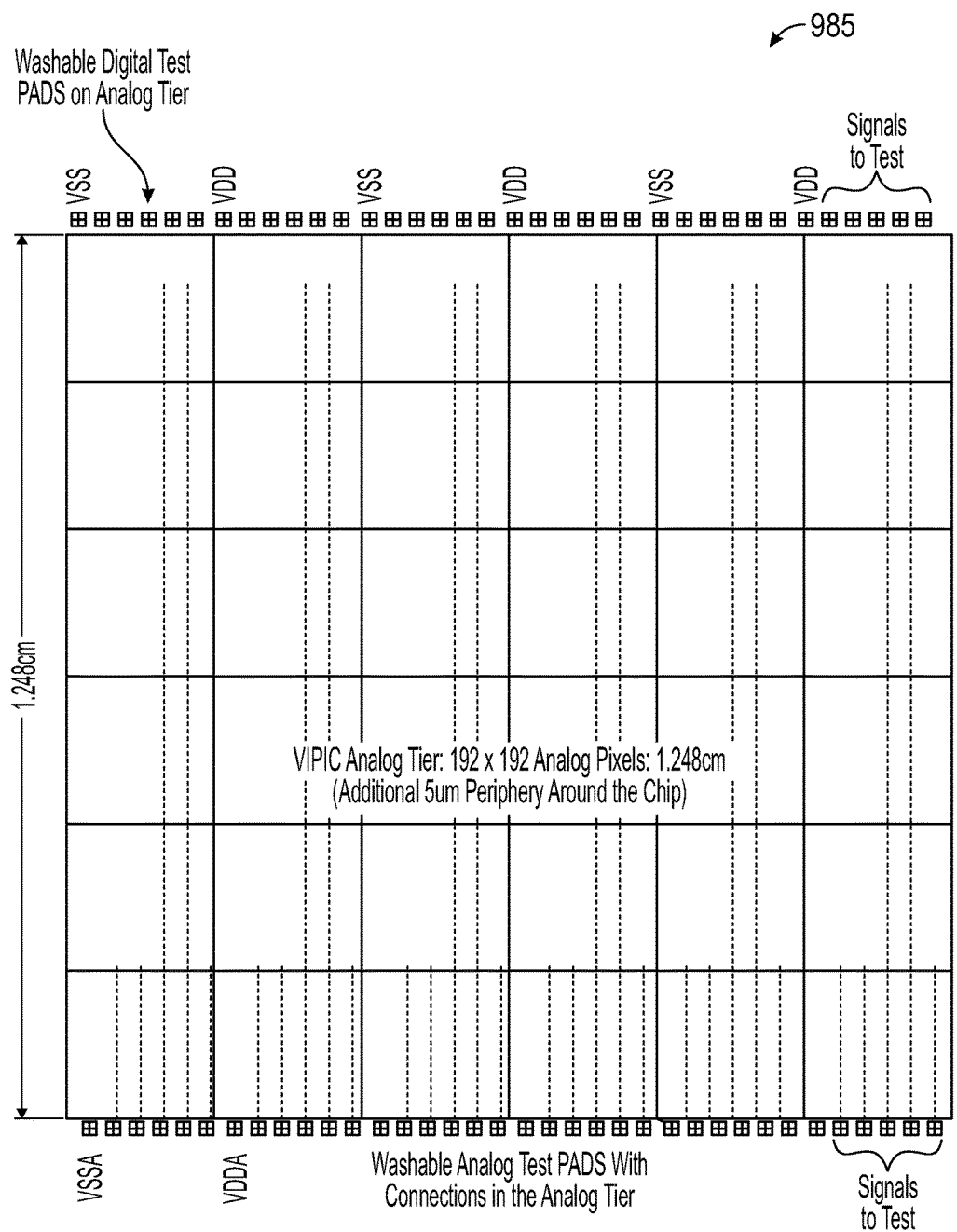

Not that temporary washable PADs as shown in FIG. 26 can be added to test known good dies. It should be appreciated that FIG. 26 is not to scale and that the temporary washable pads are in the 5 um periphery and the ASIC is approximately 1.25 cm×1.25 cm. It should be further appreciated that the various parameters and measurements and numerical values discussed herein are presented for illustrative purposes only and are not considered limiting features of the disclosed embodiments. Note that a map of known good dies can be identified by testing the configuration register on the digital side and the analog biases on the analog side.

FIG. 17 illustrates a logic diagram of the electrical layout of a digital pixel circuit 8 that includes a hit holder 822 (i.e., the hit holder block in FIG. 17) and one or more hit counter(s) 824 (i.e., the hit counters block in FIG. 17), in accordance with an example embodiment.

FIG. 18 illustrates a logic diagram of the electrical layout of a first stage hit processor 822, in accordance with an example embodiment. The first stage hit processor 822 in FIG. 18 includes a spill protect circuit 828 that provides output that is fed as input to a Seitz's arbiter circuit 830. The spill protect circuit 828 includes a variety NAND, NOR and other logical electronic components such as a flip-flop 842. Output from a counter circuit 834 is also fed as input to the Seitz's arbiter circuit 830. Output from the Seitz's arbiter circuit 830 can be provided as input to NOR gates 835 and 841 whose outputs are fed to an RS (Reset Priority) circuit 836. Additionally, the output NAND gates 831 and 837 can fed as input to NOR gates 833 and 839. The output from NOR gates 833 and 839 is also respectively provided as input to the NOR gates 835 and 841. Note that in the diagram depicted in FIG. 18, the "a" represents "reset and not set" and the "b" represents "set and not reset".

FIG. 19 illustrates a logic diagram of the electrical layout of a second stage 850 depicting FIG. 19 of the hit processor 820 shown in FIG. 17, in accordance with an example embodiment. The second stage 850 shown in FIG. 19 of the hit processor 820 depicted in FIG. 19 includes, for example, a logic circuit 852 having s, sb, A, B inputs and a Q output. At least a NAND gate 851 provides an output that is fed as input to the circuit 852. The second stage 850 shown in FIG. 19 of the hit processor 820 shown in FIG. 17 can also include logic components 853 and 855. The logic component or logic circuit 855 can provide output that is fed as input to a NOR gate 854. The Q output from the logic circuit 852 can be provided as input to the NOR gate 855 along with the output from the logic circuit 855. Output from the NOR gate 855 is fed as input to a NAND gate 856 whose output is provided to logic circuit 858. Output from a NOR gate 859 can be provided as input to the logic circuit 858 which can also be electrical connected to a logic circuit 860.

FIGS. 20A and 20B illustrate a logic diagram depicting the electrical layout of a gray-code counter 870, in accordance with an example embodiment. FIGS. 21A and 21B illustrate a logic diagram 881 depicting the electrical layout of digital pixel circuitry 880 including counters and other electrical components, in accordance with an example embodiment.

Figure 22:
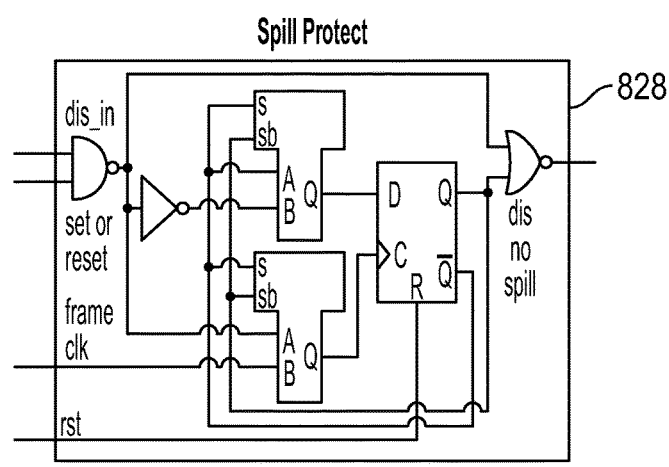
FIG. 22 illustrates a logic diagram depicting the electrical layout of a spill protection circuit, in accordance with an example embodiment.

The timing diagram 881 shows the use of two counters for alternate counting of the hits and reading out the data, including resetting of counters after completion of every readout. FIG. 22 illustrates a logic diagram depicting the electrical layout of a spill protection circuit 828, in accordance with an example embodiment. Note that the spill protection circuit is the same circuit 828 shown in FIG. 18 except shown in greater detail in FIG. 22.

FIG. 23 illustrates a logic diagram depicting the electrical layout of a double discriminator window enable circuit 890, in accordance with an example embodiment. That is, FIG. 23 depicts a block diagram of the amplitude window discrimination logic with selection circuitry for activation of this function. Timing diagrams 891 and 893 are also depicted in FIG. 23, which show two possible situations that may occur when a signal passes the low amplitude threshold with the amplitude logic enabled. These possible situations are a) a signal is above the amplitude window; and b) the signal is inside the amplitude window.

FIG. 24 illustrates a logic diagram depicting the electrical layout of a set first bit circuit 900, in accordance with an example embodiment.

FIG. 25 illustrates a schematic diagram depicting the electrical layout of a priority encoder circuit 920, in accordance with an example embodiment. As shown in FIG. 25, the priority encoder circuit 920 includes a number of pixels 922, 924, 926, 928, 930, 932, 934, 936 with respect to switches 938, 940, 944, 946, 962, 964, 968, and 970. Additional switches 942, 948, 966, and 972 are also depicted in FIG. 25 with respect to switches 950, 960 and finally to switch 952 which when activated enables a hit 931. Timing diagrams 925, 927 and 929 are shown on the left hand side of FIG. 25. For example, the timing diagram 925 is indicative of readoutControl as seen by the pixel (select pixel). "Pixel enabled" is indicated by the falling edge of "selectPixel" and "pixel disabled" is indicated by the rising edge of "selectPixel". A timing diagram 939 is shown on the right hand side of FIG. 25 and represents readoutControl broadcasted by the output serializer. The section 937 of timing diagram 939 is indicative of the address generated by the priority encoder and valid counter value. Line 931 indicates the highest priority pixel with respect to pixel 922 (e.g., "hit") and line 935 represents a pixel selected by default if no other hits are encountered and the counter value is '0'. Line 941 is shown with respect to the timing diagram 939 and pixel 934 (e.g., "hit").

FIG. 26 illustrates layout diagrams of a VIPIC digital tier 983 and a VIM analog tier 985 having washable analog test PADS with connections in the analog tier, in accordance with an example embodiment. The example VIPIC digital tier 983 shown in FIG. 26 is indicated as constituting a plurality of 6×6 sub-chips. The example VIPIC analog tier 985 shown in FIG. 26 is indicating in the context of 192×192 analog pixels. Not that temporary washable PADs as shown in FIG. 26 can be added to test known good dies as discussed previously It can be appreciated that the example embodiments illustrated in FIGS. 1-27 serve only as examples to illustrate several ways of implementation of the present disclosure. Such example embodiments should not be construed as to limit the spirit and scope of the example embodiments of the present disclosure. It should be noted that those skilled in the art may still make various modifications or variations without departing from the spirit and scope of the example embodiments. Such modifications and variations shall fall within the protection scope of the example embodiments, as defined in attached claims.

The invention claimed is:

1. A three-dimensional integrated edgeless pixel detector apparatus, comprising:
   a large area multi-tier three-dimensional integrated edgeless detector having:
      a sensor layer comprising a matrix of sensor pixels; and
      at least two ASIC (Application Specific Integrated Circuit) layers comprising at least one analog tier and at least one digital tier configured for radiation spectroscopy or imaging with a zero suppressed readout or a full frame readout, wherein said at least one digital tier is edgeless and subdivided into a matrix of at least a 1×1 dimension of functionally complete and independent sub-chips, wherein each sub-chip among said sub-chips includes circuit elements that are not assigned to an individual pixel, but which is used to perform a reading out of a said sub-chip-related group of pixels without extending a placement of any portion of common circuitry external to an area occupied by said sub-chip-related group of pixels clamped in a readout manner with respect to a sub-chip among said sub-chips.

2. The apparatus of claim 1 further comprising a dead-time-less operation capable of continuously processing signals within user defined time frames.

3. The apparatus of claim 1 further comprising a segmented sensor with a plurality of sensor pixels and a matching segmented analog tier with a plurality of analog pixels.

4. The apparatus of claim 3 wherein each analog pixel among said plurality of sensor pixels comprises: at least one charge sensitive amplifier with sensor leakage current compensation, a shaping filter and at least one comparator.

5. The apparatus of claim 3 wherein said at least one digital tier comprises a digital functionality that processes signals from said plurality of analog pixels of said at least one analog tier and transfers data from said apparatus.

6. The apparatus of claim 4 wherein said at least one analog tier and said at least one digital tier exchange signals through a bonding interface such that a multitude of configuration information is transferred from said at least one digital tier to said at least one analog tier and results of an output from said at least one comparator are transferred from said at least one analog tier to said at least one digital tier for further processing.

7. The apparatus of claim 3 wherein:
within each analog pixel among said plurality of analog pixels exchange signals occur in a plurality of specific locations which creates a particular physical interconnect pattern;
an array of interconnect pattern exists in said at least one analog tier; and
a corresponding image of said array of interconnect pattern exists in said at least one digital tier.

8. The apparatus of claim 1 wherein said at least one digital tier is edgeless and comprises an array of physically indivisible edgeless sub-chips.

9. The apparatus of claim 8 wherein each sub-chip among said sub-chips, further comprises:
at least one hit processor that register hits, wherein said at least one hit processor comprises at least one hit holder and at least one hit counter;
at least one priority encoder for readout of zero suppressed data;
at least one configuration register that programs analog and digital functions within a pixel; and
at least one output serializer for high speed data readout with mode selection; and
a plurality of other chip level functionalities including at least one driver and at least one receiver.

10. The apparatus of claim 9 wherein said at least one hit holder:
accepts an output from a plurality of comparators from the analog pixel, said plurality of comparators configured with either single level discrimination or configured as a window discriminator or configured as an ADC (Analog to Digital Converter);
assigns hits to correct time frames;
interfaces with said at least one hit counter; and
requests said at least one priority encoder to read valid data.

11. The apparatus of claim 9 wherein said at least one hit holder:
arbitrates between changes of time frame and comparator outputs such that there is lossless registration of radiation events and minimizes a duration of a comparator output pulse output from at least one comparator.

12. The apparatus of claim 9 wherein said at least one hit counter processes pulses received from said at least one hit holder and sends results to at least one output serializer, and wherein said at least one hit counter further comprises:
at least one counter in a write state counts a number of pulses in a time frame and provides time of arrival information of at least one pulse within said time frame; and
wherein said at least one counter in a read state transfers data to said at least one output serializer.

13. The apparatus of claim 12 wherein said at least one counter:
in said read state is automatically reset after a readout;
is not toggled between said write state and said read state at a change of said time frame if no new comparator pulses are received;
is automatically reset in said read state if there is no readout within a time frame and wherein said at least one counter is subsequently toggled to said write state without losing a comparator pulse arriving concurrently.

14. The apparatus of claim 12 wherein said at least one counter counts in a gray-code so as to minimize power consumption and avoid switching glitches.

15. The apparatus of claim 9 wherein said at least one priority encoder:
generates a priority list of pixels for readout;
generates an address of a pixel during readout;
enables only one pixel for readout at a time; and
generates a read request and carries said read request in a read request path to said at least one output serializer.

16. The apparatus of claim 15 wherein said at least one priority encoder utilizes pulses generated by said at least one output serializer propagated in an opposite direction of said read request path for disabling a pixel for readout and enabling a next pixel in the said priority list of pixels.

17. The apparatus of claim 9 wherein said at least one output serializer facilitates high speed data transfer and allows for time frame changes, such that a readout of a pixel matrix is disabled while a time frame change is propagated across at least one sub-chip, thereby maintaining an integrity of an output data stream and a reduced data transfer efficiency loss.

18. The apparatus of claim 9 wherein an output data packet is reconfigurable by selecting various modes and changing a number of bits that are readout and optimizing said output data packet for zero-suppressed modes by sending addresses of pixels with hits and imaging modes by removing pixel addresses from said output data packet, while maintaining data integrity and synchronization with data acquisition of said apparatus.

19. A method of configuring a three-dimensional integrated edgeless pixel detector apparatus, said method comprising:
providing a large area multi-tier three-dimensional integrated edgeless detector having:
a sensor layer comprising a matrix of sensor pixels; and
at least two ASIC layers comprising at least one analog tier and at least one digital tier configured for radiation spectroscopy or imaging with a zero suppressed readout or a full frame readout, wherein said at least one digital tier is edgeless and subdivided into a matrix of at least a 1×1 dimension of functionally complete and independent sub-chips, wherein each sub-chip among said sub-chips includes circuit elements that are not assigned to an individual pixel, but which is used to perform a reading out of a said sub-chip-related group of pixels without extending a placement of any portion of common circuitry external to an area occupied by said sub-chip-related group of pixels clamped in a readout manner with respect to a sub-chip among said sub-chips.

20. The method of claim 19 further comprising configuring apparatus to include a dead-time-less operation capable of continuously processing signals within user defined time frames.

21. The method of claim 19 further comprising providing a segmented sensor with a plurality of sensor pixels and a matching segmented analog tier with a plurality of analog pixels.

22. The method of claim 21 further comprising configuring said plurality of sensor pixels such that each analog pixel among said plurality of sensor pixels comprises: at least one charge sensitive amplifier with sensor leakage current compensation, a shaping filter and at least one comparator.

23. The method of claim 21 further comprising configuring said at least one digital tier to comprise a digital functionality that processes signals from said plurality of analog pixels of said at least one analog tier and transfers data from said apparatus.

24. The method of claim 22 wherein said at least one analog tier and said at least one digital tier exchange signals through a high density bonding interface such that a multitude of configuration information is transferred from said at least one digital tier to said at least one analog tier and results of an output from said at least one comparator are transferred from said at least one analog tier to said at least one digital tier for further processing.

25. The method of claim 21 wherein:
within each analog pixel among said plurality of analog pixels exchange signals occur in a plurality of specific locations which creates a particular physical interconnect pattern;
an array of interconnect pattern exists in said at least one analog tier; and
a corresponding image of said array of interconnect pattern exists in said at least one digital tier.

26. The method of claim 23 wherein said at least one digital tier is edgeless and comprises an array of physically indivisible edgeless sub-chips.

27. The method of claim 26 further comprising configuring at least one digital sub-chip among said sub-chips to further include:
at least one hit processor that register hits, wherein said at least one hit processor comprises at least one hit holder and at least one hit counter;
at least one priority encoder for readout of zero suppressed data;
at least one configuration register that programs analog and digital functions within a pixel; and
at least one output serializer for high speed data readout with mode selection; and
a plurality of other chip level functionalities including at least one driver and at least one receiver.

28. The method of claim 27 further comprising configuring said at least one hit holder to:
accept an output from a plurality of comparators from the analog pixel, said plurality of comparators configured with either single level discrimination or configured as a window discriminator or configured as an ADC (Analog to Digital Converter);
assign hits to correct time frames;
interface with said at least one hit counter; and
request said at least one priority encoder to read valid data.

29. The method of claim 27 wherein said at least one hit holder:
arbitrates between changes of time frame and comparator outputs such that there is lossless registration of radiation events and minimizes a duration of a comparator output pulse output from at least one comparator.

30. The method of claim 27 wherein said at least one hit counter processes pulses received from said at least one hit holder and sends results to at least one output serializer, and wherein said at least one hit counter further comprises:
at least one counter in a write state counts a number of pulses in a time frame and provides time of arrival information of at least one pulse within said time frame; and wherein said at least one counter in a read state transfers data to said at least one output serializer.

31. The method of claim 30 further comprising configuring said at least one counter such that said at least one counter:
in said read state is automatically reset after a readout;
is not toggled between said write state and said read state at a change of said time frame if no new comparator pulses are received;
is automatically reset in said read state if there is no readout within a time frame and wherein said at least one counter is subsequently toggled to said write state without losing a comparator pulse arriving concurrently.

32. The method of claim 30 further comprising configuring said at least one counter to count in a gray-code so as to minimize power consumption and avoid switching glitches.

33. The method of claim 27 further comprising configuring said at least one priority encoder, such that said at least one priority encoder:
generates a priority list of pixels for readout;
generates an address of a pixel during readout;
enables only one pixel for readout at a time; and
generates a read request and carries said read request in a read request path to said at least one output serializer.

34. The method of claim 33 further comprising configuring said at least one priority encoder to utilize pulses generated by said at least one output serializer propagated in an opposite direction of said read request path for disabling a pixel for readout and enabling a next pixel in the said priority list of pixels.

35. The method of claim 27 further comprising configuring said at least one output serializer to facilitate high speed data transfer and allow for time frame changes, such that a readout of a pixel matrix is disabled while a time frame change is propagated across at least one sub-chip, thereby maintaining an integrity of an output data stream and a minimal data transfer efficiency loss.

36. The method of claim 27 wherein an output data packet is reconfigurable by selecting various modes and changing a number of bits that are readout and optimizing said output data packet for zero-suppressed by sending addresses of pixels with hits and imaging modes by removing pixel addresses from said output data packet, while maintaining data integrity and synchronization with data acquisition of said apparatus.

* * * * *

UNITED STATES PATENT AND TRADEMARK OFFICE
CERTIFICATE OF CORRECTION

| | | |
|---|---|---|
| PATENT NO. | : 10,352,991 B2 | Page 1 of 1 |
| APPLICATION NO. | : 15/214758 | |
| DATED | : July 16, 2019 | |
| INVENTOR(S) | : Farah Fahim | |

It is certified that error appears in the above-identified patent and that said Letters Patent is hereby corrected as shown below:

In the Specification (Column 1, Lines 12-20) should read:
STATEMENT OF GOVERNMENT RIGHTS
The invention described in this patent application was made with Government support under the Fermi Research Alliance, LLC, Contract Number DE-AC02-07CH11359 awarded by the U.S. Department of Energy. The Government has certain rights in the invention.

Signed and Sealed this
Twenty-ninth Day of August, 2023

Katherine Kelly Vidal
*Director of the United States Patent and Trademark Office*